US007969805B2

(12) United States Patent
Thom et al.

(10) Patent No.: US 7,969,805 B2
(45) Date of Patent: Jun. 28, 2011

(54) COUPLING METHODS AND ARCHITECTURES FOR INFORMATION PROCESSING

(75) Inventors: Murray C. Thom, Vancouver (CA); Andrew J. Berkley, Vancouver (CA); Alexander Maassen van den Brink, Taipei (TW)

(73) Assignee: D-Wave Systems, Inc., Burnaby, British Columbia (CA)

( * ) Notice: Subject to any disclaimer, the term of this patent is extended or adjusted under 35 U.S.C. 154(b) by 78 days.

(21) Appl. No.: 12/575,345

(22) Filed: Oct. 7, 2009

(65) Prior Publication Data

US 2010/0085827 A1 Apr. 8, 2010

Related U.S. Application Data

(62) Division of application No. 11/247,857, filed on Oct. 10, 2005, now Pat. No. 7,619,437.

(60) Provisional application No. 60/640,420, filed on Dec. 30, 2004.

(51) Int. Cl.
*H01L 39/00* (2006.01)

(52) U.S. Cl. ...................................... 365/209

(58) Field of Classification Search .............. 365/209; 977/774, 933
See application file for complete search history.

(56) References Cited

U.S. PATENT DOCUMENTS

| 4,496,854 A | 1/1985 | Chi et al. ............... 307/306 |
| 4,937,525 A | 6/1990 | Daalmans ............... 324/248 |
| 5,128,675 A | 7/1992 | Harada ................. 341/133 |
| 6,605,822 B1 | 8/2003 | Blais et al. ............... 257/34 |
| 6,627,916 B2 | 9/2003 | Amin et al. ............... 257/31 |
| 6,753,546 B2 | 6/2004 | Tzalenchuk et al. ........ 257/31 |
| 6,838,694 B2 | 1/2005 | Esteve et al. ............... 257/34 |
| 6,984,846 B2 | 1/2006 | Newns et al. ............... 257/31 |
| 7,051,393 B2 | 5/2006 | Cox ...................... 15/30 |
| 7,133,888 B2 | 11/2006 | Kohn et al. ............... 708/446 |
| 7,335,909 B2 | 2/2008 | Amin et al. ............... 257/34 |
| 7,605,600 B2 | 10/2009 | Harris ................... 326/1 |
| 7,619,437 B2 | 11/2009 | Thom et al. ............... 326/5 |
| 7,639,035 B2 | 12/2009 | Berkley .................. 326/2 |
| 2003/0038285 A1 | 2/2003 | Amin et al. ............... 257/31 |
| 2003/0071258 A1 | 4/2003 | Zagoskin et al. ........... 257/31 |

(Continued)

FOREIGN PATENT DOCUMENTS

CA 2386426 5/2001

(Continued)

OTHER PUBLICATIONS

U.S. Appl. No. 60/638,600, filed Dec. 23, 2004, Rose.

(Continued)

*Primary Examiner* — Zandra V. Smith
*Assistant Examiner* — Paul E Patton
(74) *Attorney, Agent, or Firm* — Seed IP Law Group PLLC

(57) ABSTRACT

A structure comprising (i) a first information device, (ii) a second information device, (iii) a first coupling element and (iv) a second coupling element is provided. The first information device has at least a first lobe and a second lobe that are in electrical communication with each other. The second information device and has at least a first lobe and a second lobe that are in electrical communication with each other. The first coupling element inductively couples the first lobe of the first information device to the first lobe of the second information device. The second coupling element inductively couples the first lobe of the first information device to the second lobe of the second information device.

16 Claims, 12 Drawing Sheets

U.S. PATENT DOCUMENTS

| | | | |
|---|---|---|---|
| 2003/0224753 A1 | 12/2003 | Bremond et al. | 455/339 |
| 2004/0016918 A1 | 1/2004 | Amin et al. | 257/14 |
| 2005/0001209 A1 | 1/2005 | Hilton et al. | 257/20 |
| 2005/0082519 A1 | 4/2005 | Amin et al. | 257/13 |
| 2005/0250651 A1 | 11/2005 | Amin et al. | 505/846 |
| 2005/0256007 A1 | 11/2005 | Amin et al. | 505/170 |
| 2006/0097747 A1 | 5/2006 | Amin | 326/6 |
| 2006/0147154 A1 | 7/2006 | Thom et al. | 385/37 |
| 2006/0225165 A1* | 10/2006 | Maassen van den Brink et al. | 977/933 |
| 2007/0180586 A1 | 8/2007 | Amin | 977/755 |
| 2008/0238531 A1 | 10/2008 | Harris | 327/528 |
| 2008/0258753 A1 | 10/2008 | Harris | 326/4 |
| 2008/0274898 A1 | 11/2008 | Johnson et al. | 505/190 |
| 2009/0078932 A1 | 3/2009 | Amin | 257/31 |
| 2009/0192041 A1 | 7/2009 | Johansson et al. | 505/170 |

FOREIGN PATENT DOCUMENTS

| | | |
|---|---|---|
| WO | 2004/102470 | 11/2004 |
| WO | 2005/093649 | 10/2005 |
| WO | 2006/024939 | 3/2006 |

OTHER PUBLICATIONS

Averin et al., "Variable Electrostatic Transformer: Controllable Coupling of Two Charge Qubits," *Physical Review Letters* 91(5):057003-1-057003-4, Aug. 1, 2003.

Blatter et al., "Design aspects of superconducting-phase quantum bits," *Physical Review B* 63:174511-1-174511-9, 2001.

Bocko et al., "Prospects for Quantum Coherent Computation Using Superconducting Electronics," *IEEE Transactions on Applied Superconductivity* 7(2):3638-3641, 1997.

Butcher, "Advances in Persistent-Current Qubit Research: Inductively Coupled Qubits and Novel Biasing Methods," Graduate Thesis, Delft University of Technology, 52 pages, Jan. 10, 2002.

Clarke et al., "Quiet Readout of Superconducting Flux States," *Physica Scripta. T102*:173-177, 2002.

Cosmelli et al., "Controllable Flux Coupling for the Integration of Flux Qubits," arXiv:cond-mat/0403690v1, pp. 1-10, Mar. 29, 2004.

Deutsch, "Quantum Theory, the Church-Turing Principle and the Universal Quantum Computer," *Proc. Roy. Soc. Lond. A400*:97-117, 1985.

Farhi et al., "Quantum Adiabatic Evolution Algorithms versus Simulated Annealing," MIT-CTP #3228, arXiv:quant-ph/0201031 v1, pp. 1-16, Jan. 8, 2002.

Feynman, "Simulating Physics with Computers," *International Journal of Theoretical Physics* 21(6/7):467-488, 1982.

Filipov et al., "Tunable Transformer for Qubits Based on Flux States," *IEEE ASC Preprint 5EL02*, 2002.

Friedman et al., "Quantum superposition of distinct macroscopic states," *Nature* 406:43-46, Jul. 6, 2000.

Fritzsch et al., "SNS and SIS Josephson Junctions with Dimensions Down to the Sub-µm Region Prepared by an Unified Technology," *Supercond. Sci. Tech.* 12:880-882, 1999.

Il'ichev et al., "Continuous Monitoring of Rabi Oscillations in a Josephson Flux Qubit," *Physical Review Letters* 91(9):097906-1-097906-4, week ending Aug. 29, 2003.

Kaiser et al., "Coherent Atomic Matter Waves: Proceedings of the Les Houches Summer School, Course LXXII," Springer-Verlag, New York, pp. 184-188, 294-295, and 302-303, 1999.

Levitov et al., "Quantum Spin Chains and Majorana States in Arrays of Coupled Qubits," arXiv:cond-mat/0108266v2, 7 pages, 2001.

Makhlin et al., "Quantum-State Engineering with Josephson-Junction Devices," *Reviews of Modern Physics* 73(2):357-400, Apr. 2001.

Mooij et al., "Josephson Persistent-Current Qubit," *Science* 285:1036-1039, Aug. 13, 1999.

Nielsen et al., *Quantum Computation and Quantum Information*, Cambridge University Press, Cambridge, 2000, "7.8 Other implementation schemes," pp. 343-345.

Orlando et al., "Superconducting Persistent-Current Qubit," *Physical Review B* 60(22):15 398-15 413, Dec. 1, 1999.

Plourde et al., "Entangling Flux Qubits with a Bipolar Dynamic Indictance," *Physical Review B* 70(140501), 4 pages, 2004.

Shnirman et al., "Quantum Manipulations of Small Josephson Junctions," *Physical Review Letters* 79(12):2371-2374, 1997.

Shoji et al., "New Fabrication Process for Josephson Tunnel Junctions with (Niobium Nitride, Niobium) Double-Layered Electrodes," *Appl. Phys. Lett.* 41(11):1097-1099, 1982.

Shor, "Introduction to Quantum Algorithms," AT&T Labs—Research, arXiv:quant-ph/0005003 v2, pp. 1-17, Jul. 6, 2001.

"A High-Level Look at Optimization: Past, Present and Future," e-Optimization.Community, May 2000, pp. 1-5.

Allen et al., "Blue Gene: A Vision for Protein Science Using a Petaflop Supercomputer," *IBM Systems Journal* 40(2):310-327, 2001.

Amin et al., "Decoherence in Adiabatic Quantum Computation," arXiv:0708.0384v1 [cond-mat.mes-hall], pp. 1-4, Aug. 2, 2007.

Amin M.H., "Systems, Devices and Methods for Controllably Coupling Qubits," U.S. Appl. No. 60/975,083, filed Sep. 25, 2007.

Berkley et al., "Scalable Superconducting Flux Digital-to-Analog Conversion Using a Superconducting Inductor Ladder Circuit," U.S. Appl. No. 60/917,884, filed May 14, 2007.

Berkley et al., "Systems, Methods and Apparatus for Local Programming of Quantum Processor Elements," U.S. Appl. No. 11/950,276, filed Dec. 4, 2007.

Berkley, A.J., "Architecture for Local Programming of Quantum Processor Elements Using Latching Qubits," U.S. Appl. No. 12/109,847, filed Apr. 25, 2008.

Biamonte et al., "Physical Implementations for a Universal Quantum Computer and Related Coupling Devices," U.S. Appl. No. 60/910,445, filed Apr. 5, 2007.

Biamonte et al., "Physical Realizations of a Universal Adiabatic Quantum Computer," U.S. Appl. No. 12/098,348, filed Apr. 4, 2008.

Biamonte et al., "Realizable Hamiltonians for Universal Adiabatic Quantum Computers," arXiv:0704.1287v1 [quant-ph], pp. 1-4, Apr. 10, 2007.

Brennen et al., "Why Should Anyone Care About Computing with Anyons?," arXiv:0704.2241v1, pp. 1-19, Apr. 18, 2007.

Bunyk et al., "Systems, Methods and Apparatus for Digital-to-Analog Conversion of Superconducting Magentic Flux Signals," U.S. Appl. No. 12/120,354, filed May 14, 2008.

Choi, V., "Systems, Devices, and Methods for Analog Processing," U.S. Appl. No. 60/986,554, filed Nov. 8, 2007.

Choudhury, *Handbook of Microlithography, Micromachining and Microfabrication vol. 1: Microlithography*, The International Society for Optical Engineering, Bellingham, WA, 1999.

Dolan et al., "Optimization on the NEOS Server," from *SIAM News* 35(6): 1-5, Jul./Aug. 2002.

Fourer et al., "Optimization as an Internet Resource," *Interfaces* 31(2):130-150, Mar./Apr. 2001.

Ghiu et al., "Asymmetric two-output quantum processor in any dimension," arXiv:quant-ph/0610138v1, pp. 1-8, Oct. 17, 2006.

Harris et al., "Sign and Magnitude Tunable Coupler for Superconducting Flux Qubits," arXiv:cond-mat/0608253 v1, Aug. 11, 2006.

Harris, "Systems, Devices, and Methods for Controllably Coupling Qubits," Office Action mailed Sep. 3, 2009 for U.S. Appl. No. 12/017,995, 11 pages.

Harris, "Systems, Devices, and Methods for Controllably Coupling Qubits," Preliminary Amendment filed Jun. 18, 2009 for U.S. Appl. No. 12/017,995, 7 pages.

Harris, R.G., "Systems, Devices, and Methods for Controllably Coupling Qubits," U.S. Appl. No. 12/017,995, filed Jan. 22, 2008.

Hillery et al., "Approximate programmable quantum processors," arXiv:quant-ph/0510161v1, pp. 1-7, Oct. 20, 2005.

Hioe, *Quantum Flux Parametron—A Single Quantum Flux Superconducting Logic Device*, World Scientific Publishing Co. Pte. Ltd., Singapore, pp. 23-43, 1991.

Inokuchi et al., "Analog Computation using Quantum-Flux Parametron Devices," *Physica C*, 357-360, pp. 1618-1621, Department of Electrical Engineering, Hokkaido University, Kita 13, Nishi 8, Sapporo 060-8628, Japan, Jan. 12, 2001.

International Search Report, mailed Jan. 21, 2009, for PCT/CA2008/001778, 3 pages.

International Search Report, mailed Jul. 18, 2008, for PCT/CA2008/000841, 4 pages.

International Search Report, mailed Jul. 25, 2008, for PCT/CA2008/000660, 4 pages.
International Search Report, mailed May 20, 2008, for PCT/CA2008/000138, 3 pages.
International Search Report, mailed Jan. 5, 2009, for PCT/CA2008/001724, 3 pages.
Ioffe et al., "Environmentally Decoupled sds-wave Josephson Junctions for Quantum Computing," *Nature* 398:679-681, 1999.
Johnson et al., "Systems, Devices, and Methods for Controllably Coupling Qubits," Office Action mailed Jul. 2, 2009, for U.S. Appl. No. 12/113,753, 9 pages.
Johnson et al., "Systems, Devices, and Methods for Controllably Coupling Qubits," Response filed Aug. 18, 2009, for U.S. Appl. No. 12/113,753, 4 pages.
Johnson et al., "Systems, Devices, and Methods for Controllably Coupling Qubits," Office Action mailed Nov. 17, 2009, for U.S. Appl. No. 12/113,753, 9 pages.
Johnson et al., "Systems, Devices, and Methods for Controllably Coupling Qubits," Amendment filed Feb. 12, 2010, for U.S. Appl. No. 12/113,753, 9 pages.
Koch et al., "Model for 1/F Flux Noise in SQUIDs and Qubits," *Physical Review Letters* 98(26), 16 pages, 2007.
Levinson, *Principles of Lithography*, The International Society for Optical Engineering, Bellingham, WA, 2001.
Maassen van den Brink et al., "Mediated tunable coupling of flux qubits," *New Journal of Physics* 7:1-18, 2005.
Madou, *Fundamentals of Microfabrication*, Second Edition, CRC Press LLC, Boca Raton, Florida, 2002.
Maibaum et al., "Systems, Methods and Apparatus for a Differential Superconducting Flux Digital-to-Analog Converter," U.S. Appl. No. 60/975,487, filed Sep. 26, 2007.
Maibaum et al., "Systems, Devices, and Methods for Analog Processing," U.S. Appl. No. 61/039,710, filed Mar. 26, 2008.
Majer et al., "Spectroscopy on Two Coupled Flux Qubits", arXiv:cond-mat/0308192 v1, Aug. 10, 2003.
Mc Hugh et al., "A quantum computer using a trapped-ion spin molecule and microwave radiation," arXiv:quant-ph/0310015v2, pp. 1-9, Apr. 13, 2004.
Mooij et al., "Josephson Persistent-Current Qubit," *Science* 285: 1036-1039, Aug. 13, 1999.
Nielsen, "Cluster-State Quantum Computation," arXiv:quant-ph/0504097v2, pp. 1-15, Jul. 1, 2005.
Nielsen et al., *Quantum Computation and Quantum Information*, Cambridge University Press, Cambridge, 2000, "7 Quantum Computers: Physical Realization," pp. 277-352.
Paternostro et al., "Quantum-State Transfer in Imperfect Artificial Spin Networks," *Physical Review A* 71(4):042311, 2005.
Rose et al., "Systems, Devices, and Methods for Interconnected Processor Topology," U.S. Appl. No. 12/013,192, filed Jan. 11, 2008.
Ryan et al., "Characterization of complex quantum dynamics with a scalable NMR information processor," arXiv:quant-ph/0506085v2, pp. 1-4, Feb. 13, 2006.
Shirts et al., "Computing: Screen Savers of the Word Unite!," *Science Online* 290(5498): 1903-1904, Dec. 8, 2000.
Thaker et al., "Quantum Memory Hierarchies: Efficient Designs to Match Available Parallelism in Quantum Computing," arXiv:quant-ph/0604070v1, 12 pages, Apr. 10, 2006.
Van Zant, *Microchip Fabrication*, Fourth Edition, McGraw-Hill, New York, 2000.
Vlasov, "Von Neumann Quantum Processors," arXiv:quant-ph/0311196v1, pp. 1-8, Nov. 27, 2003.
Williams et al., *Explorations in Quantum Computing*, Springer, New York, Dec. 12, 1997, Chapter 11, "How to Make a Quantum Computer," pp. 241-265.
Written Opinion, mailed Jul. 18, 2008, for PCT/CA2008/000841, 5 pages.
Written Opinion, mailed Jul. 25, 2008, for PCT/CA2008/000660, 2 pages.

* cited by examiner

COUPLING METHODS AND ARCHITECTURES FOR INFORMATION PROCESSING

CROSS-REFERENCE TO RELATED APPLICATION

This application is a divisional of U.S. patent application Ser. No. 11/247,857, filed Oct. 10, 2005 now U.S. Pat. No. 7,619,437, which application is incorporated herein by reference in its entirety.

CROSS REFERENCE TO RELATED APPLICATIONS

This application claims priority to U.S. Patent Application No. 60/640,420, filed Dec. 30, 2004, which is hereby incorporated by reference in its entirety.

1. FIELD OF THE INVENTION

This invention relates to the field of quantum computing and to the field of superconducting devices.

2. BACKGROUND

In 1982, Richard Feynman proposed that a controllable quantum system could be used to simulate other quantum systems more efficiently than conventional computers. See Feynman, 1982, *International Journal of Theoretical Physics* 21, pp. 467-488, which is hereby incorporated by reference in its entirety. This controllable quantum system is now commonly referred to as a quantum computer, and effort has been put into developing a general purpose quantum computer that can be used to simulate quantum systems or run specialized quantum algorithms. In particular, solving a model for the behavior of a quantum system commonly involves solving a differential equation related to the Hamiltonian of the quantum system. David Deutsch observed that a quantum system could be used to yield a time savings, later shown to be an exponential time savings, in certain computations. If one had a problem, modeled in the form of an equation that represented the Hamiltonian of the quantum system, the behavior of the system could provide information regarding the solutions to the equation. See Deutsch, 1985, *Proceedings of the Royal Society of London A* 400, pp. 97-117, which is hereby incorporated by reference in its entirety.

One limitation in the quantum computing art is the identification of systems that can support quantum computation. The basis for performing quantum computation is a unit, which is hereinafter termed an information device. Information devices can have many embodiments but must fulfill several requirements. One requirement is that the information device must be reducible to a quantum two-level system, which means that it must be able to have two distinguishable quantum states that can be used for computation. The information devices must also be capable of producing quantum effects like entanglement and superposition, described below. In general, the quantum information stored in an information devices can, but does not need to be, coherent. A device with coherency has a quantum state that persists without significant degradation for a long period of time, on the order of microseconds or more. One non-limiting example of an information device is a qubit, also termed a quantum bit. A qubit is analogous to a bit in a classical (digital) computer, and is a type of information device that requires coherence. The loss of coherence is referred to herein as decoherence.

The computing power of a quantum computer increases as its basic building blocks, information devices, are coupled together in a controllable manner such that the quantum state of one information device affects the quantum state of each of the information devices to which it is coupled. This form of coupling is referred to as entanglement. Another limitation in the quantum computing art is the identification of methods that can be used to controllably entangle the states of information devices without introducing a significant source of decoherence.

2.1 Approaches to Quantum Computing

There are several general approaches to the design and operation of a quantum computer. One approach that has been put forth is circuit model quantum computing. Circuit model quantum computing requires long quantum coherence, so the type of information device used in quantum computers that support such an approach are qubits, which by definition should ideally have long coherence times. Circuit model quantum computing is based upon the premise that qubits can be acted on by logical gates, much like bits, and can be programmed using quantum logic in order to perform calculations. Research has been done to develop qubits that can be programmed to perform quantum logic functions. For example, see Shor, 2001, arXiv.org:quant-ph/0005003, which is hereby incorporated by reference in its entirety. However, reducing the decoherence of qubits such that many calculations can be performed before information stored in the qubit is destroyed has not been successfully achieved in the art.

Another approach to quantum computing, called optimization quantum computing, involves the use of a system of information devices to simulate a quantum system. This approach does not make critical use of quantum gates and circuits. Instead, it relies upon quantum effects to manipulate the states of a system of interacting information devices starting from a known initial Hamiltonian so that the final state represents the Hamiltonian of the physical system in question. In this process, quantum coherence is not a requirement, so general information devices, and not just qubits, can be used as the computational building blocks. Examples of this type of approach are adiabatic quantum computing and simulated annealing, which are described in Farhi et al., 2002, arXiv.org:quant-ph/0201031, which is hereby incorporated by reference in its entirety.

2.2 Qubits

As mentioned previously, one possible information device is a qubit, also known as a quantum bit. A qubit, while analogous to a digital bit in classical computers, has far more computational potential than a digital bit. Instead of only encoding one of two discrete states, like "0" and "1" as found in a digital bit, a qubit can also be placed in a superposition of "0" and "1." That is, the qubit can exist in both the "0" and "1" state at the same time, and so can perform a quantum computation on both states simultaneously. In general, N qubits can be in a superposition of $2^N$ states. Quantum algorithms make use of the superposition property to speed up certain computations.

In standard notation, the basis states of a qubit are referred to as the $|0\rangle$ and $|1\rangle$ states. During quantum computation, the state of a qubit, in general, is a superposition of basis states so that the qubit has a nonzero probability of occupying the $|0\rangle$ basis state and a simultaneous nonzero probability of occupying the $|1\rangle$ basis state. Mathematically, a superposition of basis states means that the overall state of the qubit, which is denoted $|\Psi\rangle$ has the form $|\Psi\rangle = a|0\rangle + b|1\rangle$ where a and b are coefficients corresponding to the probabilities $|a|^2$ and $|b|^2$, respectively. The coefficients a and b each have real and imaginary components, which allows the phase of the qubit to be characterized. The quantum nature of a qubit is largely derived from its ability to exist in a coherent superposition of basis states, and for the state of the qubit to have a phase. A qubit will retain this ability to exist as a coherent superposition of basis states when the qubit is sufficiently isolated from sources of decoherence.

To complete a computation using a qubit, the state of the qubit is measured (e.g., read out). Typically, when a measurement of the qubit is done, the quantum nature of the qubit is temporarily lost and the superposition of basis states collapses to either the $|0\rangle$ basis state or the $|1\rangle$ basis state, thus regaining its similarity to a conventional bit. The actual state of the qubit after it has collapsed depends on the probabilities $|a|^2$ and $|b|^2$ immediately prior to the readout operation.

Information devices can have all the physical properties described above for qubits. That is, the quantum state of an information device can be a superposition of basis states, and can be described by the form $|\Psi\rangle = a|0\rangle + b|1\rangle$ where a and b are coefficients corresponding to the probabilities $|a|^2$ and $|b|^2$, respectively. The quantum state of an information device also collapses to a basis state when measured. However, as mentioned in Section 2.1, information devices do not have a stringent requirement for quantum coherence, as opposed to qubits.

2.3 Superconducting Information Devices

There are many different technologies that can be used to construct quantum computers. One implementation uses superconducting materials. Quantum computers constructed with superconducting information devices have the advantage of scalability. The possibility of realizing large scale quantum computers using superconducting information devices shows promise since the technologies and processes involved in fabricating superconducting information devices are similar to those used for conventional computers, for which there already exists an established infrastructure of fabrication equipment and technological know-how. Such known fabrication techniques (e.g., chemical vapor deposition, plasma enhanced chemical vapor deposition, etc.) are described, for example, in Van Zant, 2000, *Microchip Fabrication*, Fourth Edition, McGraw-Hill, New York; Levinson, 2001, *Principles of Lithography*, The International Society for Optical Engineering, Bellingham Washington; Madou, 2002, *Fundamentals of Microfabrication*, Second Edition, CRC Press LLC, Boca Raton, Fla.; and Choudhury, 1997, *Handbook of Microlithography, Micromachining and Microfabrication Volume 1: Microlithography*, The International Society for Optical Engineering, Bellingham Wash., each of which is hereby incorporated by reference in its entirety. Toward the realization of such a computer, Shnirman et al., 1997, *Physics Review Letters* 79, 2371-2374, which is hereby incorporated by reference in its entirety, proposed an embodiment of a superconducting quantum computer using superconducting information devices comprising Josephson junctions in order to produce the required quantum effects.

Superconducting information devices can be separated into several categories depending on the physical property used to encode information. A general division of information devices separates them into charge and phase devices, as discussed in relation to qubits in Makhlin et al., 2001, *Reviews of Modern Physics* 73, pp. 357-401, which is hereby incorporated by reference in its entirety. Charge devices store and manipulate information in the charge states of the device, where elementary charges consist of pairs of electrons called Cooper pairs. A Cooper pair has a charge of 2e and consists of two electrons bound together by a phonon interaction. See, for example, Nielson and Chuang, 2000, *Quantum Computation and Quantum Information*, Cambridge University Press, Cambridge, pp. 343-345, which is hereby incorporated by reference in its entirety. Phase, or flux, devices, on the other hand, store information in the phase or flux states of the device. More recently, hybrid devices have been developed that can use both the charge and phase degrees of freedom to control information. Some examples of hybrid devices are described in U.S. Pat. No. 6,838,694 B2 to Esteve et al. as well as U.S. patent application Ser. No. 10/934,049 to Amin et al., each of which is hereby incorporated by reference in its entirety.

2.4 Superconducting Flux Devices

Superconducting flux device designs are described in Bocko et al., 1997, *IEEE Transactions on Applied Superconductivity* 7, p. 3638, as well as Makhlin et al., 2001, *Review of Modern Physics* 73, p. 357, each of which is hereby incorporated by reference in its entirety. Many other superconducting flux device designs have been described, including the persistent current qubit. See Mooij et al., 1999, *Science* 285, 1036; and Orlando et al., 1999, *Physics Review B* 60, 15398, which are hereby incorporated by reference in their entireties. The persistent current qubit consists of a loop of thick superconducting material interrupted by three Josephson junctions. The critical current value of one Josephson junction is designed to be less than that of the other two Josephson junctions, which often have the same or very similar critical currents. The persistent current qubit can be built such that the loop of superconducting material encompasses a small area (e.g., an approximate area of 1 micrometer squared).

The persistent current qubit has coherence times of between 10 nanoseconds (ns) to 100 ns. See, for example, Orlando et al., 1999, *Physics Review B* 60, 15398, and Il'ichev et al., 2003, *Physics Review Letters* 91, 097906, each of which is hereby incorporated by reference in its entirety. Some other types of flux devices comprise superconducting loops interrupt by either more or less than three Josephson junctions. See, e.g., Blatter et al., 2001, *Physics Review B* 63, 174511; and Friedman et al., 2000, *Nature* 406, 43, which are hereby incorporated by reference in their entireties.

Gradiometric flux devices are a special type of flux devices that are insensitive to homogenous magnetic fields. That is, a magnetic field which is homogenous over the entirety of a gradiometric flux device will not affect the quantum state of the device. An example of a gradiometric device is described in U.S. Pat. No. 4,937,525 to Daalmans, which is hereby incorporated by reference in its entirety. Gradiometric flux device are discussed in more detail below.

2.5 Information Device Coupling

Regardless of which type of information device is used to construct a quantum computer, it is desirable that the information devices of the quantum computer interact with each other in a controllable manner. Such interaction between the information devices of a quantum computer is referred to as coupling. Depending on implementation, different coupling methods can be used. Furthermore, a system Hamiltonian can be used to describe the states of the information devices of a quantum computer as well as the interactions between the information devices.

In coupling two flux-based superconducting information devices together, the sign of the coupling interaction in the system Hamiltonian determines the energy landscape of the system comprising the two devices. Generally, the coupling between two flux-based superconducting information devices is either ferromagnetic or anti-ferromagnetic because flux devices typically interact via their respective magnetic fluxes. That is, a change in flux in one information device will affect the flux of another information device that is coupled to it. In ferromagnetic coupling, it is energetically favorable for a change in flux of a first information device to produce a similar change in the flux of a second information device that is coupled to the first information device. For example, an increase in flux in the first information device will cause an increase in flux in the second information device when they are ferromagnetically coupled. In the anti-ferromagnetic case, the coupling will cause the opposite effect on the coupled device (e.g. a flux increase in the first device leads to a flux decrease in the second coupled device) because it is more energetically favorable. By energetically favorable, it is meant that the quantum system prefers to be in a specific configuration because the energy is lower in the specific configuration than in other configurations.

A flexible coupling scheme provides the ability to vary the strength of the coupling between information devices, shut off coupling between such devices altogether, and/or switch the sign of the coupling between such devices. By switching the sign of the coupling, it is meant that the type of coupling between two information devices is switched from ferromagnetic to anti-ferromagnetic or vice versa. Switching the sign of the coupling in circuit model quantum computing is useful for constructing specific logic gates, such as the CNOT gate described in Plourde et al., 2004, arXiv.org:quant-ph/0406049, which is hereby incorporated by reference in its entirety. Switching the coupling sign in optimization quantum computing gives greater flexibility to mapping problems that are to be solved by a quantum computer onto the quantum computer's information device grid. Here, the term information device grid refers to a set of information devices in a quantum computer in which each information device in the set is controllably coupled to at least one other information device in the set.

In one representation of the Hamiltonian of two flux information devices coupled together, $\sigma_z \otimes \sigma_z$ represents the "sigma z" coupling between two devices with a variable J as a pre-factor to indicate the strength of the coupling. When $J>0$, the coupling is anti-ferromagnetic, with a higher J meaning a stronger anti-ferromagnetic coupling. When $J<0$, the coupling is ferromagnetic, with a lower J meaning a stronger ferromagnetic coupling. When $J=0$, there is no coupling. Thus, switching the sign of J switches the type of coupling. In the general case of a two-level system, ferromagnetic coupling implies it is energetically favorable to have parallel fluxes and anti-ferromagnetic coupling implies it is energetically favorable to have anti-parallel fluxes. An example of ferromagnetic and anti-ferromagnetic coupling is coupling between two flux devices with circulating currents in their respective loops.

In ferromagnetic coupling, a clockwise superconducting current in a first information device will cause a clockwise superconducting current to be more energetically favorable than a counter-clockwise superconducting current in a second information device that is ferromagnetically coupled to the first device. Conversely, in ferromagnetic coupling, a counterclockwise superconducting current in the first device will cause a counterclockwise superconducting current to be more energetically favorable than a clockwise superconducting current in the second device. On the other hand, in anti-ferromagnetic coupling, a clockwise superconducting current in the first information device will make a counterclockwise superconducting current more energetically favorable than a clockwise superconducting current in the second anti-ferromagnetically coupled device. Further, in anti-ferromagnetic coupling, a counterclockwise superconducting current in the first device will make a clockwise superconducting current more energetically favorable than a counterclockwise superconducting current in the second device.

Superconducting information devices can be inductively coupled in a direct manner (e.g., without any intervening device), but this type of coupling is typically not controllable, meaning that the strength of the coupling cannot readily be altered. One way of coupling flux devices is through a superconducting quantum interference device, or SQUID.

A SQUID is a type of sensitive magnetometer, which means it can detect small changes in magnetic flux. See, for example, U.S. Pat. No. 6,627,916 to Amin et al., which is hereby incorporated by reference in its entirety. A SQUID comprises a superconducting loop interrupted by at least one Josephson junction. The current flowing in the superconducting loop of the SQUID can be biased in any of several different manners. For example, the current can be biased by an inductive flux positioned close to the SQUID. In another the current can be biased using a current bias from a wire connected to the SQUID. Two examples of SQUIDs that differ in the way they are biased are dc-SQUIDs (current or flux biased) and rf-SQUIDs (flux biased). SQUIDs can also generate flux in a controllable manner. Since flux devices interact via their magnetic fluxes, a SQUID-type device can be used to mediate the coupling, like the scheme suggested in Majer et al., 2003, arXiv.org:cond-mat/0308192, which is hereby incorporated by reference in its entirety.

Mooij et al., 1999, *Science* 285, 1036, which is hereby incorporated by reference in its entirety, propose a type of coupling scheme capable of switching the type of coupling between two flux devices. However, Mooij has the drawback that it is not the ferromagnetic and anti-ferromagnetic coupling types that are switched. Rather, a switch between $\sigma_z \otimes \sigma_z$ and $\sigma_z \otimes \sigma_x$ coupling is accomplished. Further, there is no way to completely turn off the coupling in Mooij.

The inductive SQUID, or INSQUID, has been proposed as another coupling device in Clarke et al., 2002, *Physica Scripta* T102, 173, which is hereby incorporated by reference in its entirety. INSQUID coupling can switch the type of coupling, but again it is not between ferromagnetic and anti-ferromagnetic coupling. It is possible to turn the INSQUID coupling off, but this is difficult to achieve.

A tunable flux transformer is described in Filippov et al., 2003, *IEEE Transactions on Applied Superconductivity* 13, 1005, which is hereby incorporated by reference in its entirety. The tunable flux transformer of Filippov et al. relies on the gradiometric nature of the employed device. The transformer itself is also gradiometric, and tunability is achieved by incorporating compound junctions with variable couplings. Thus, the transformer can be biased to couple or uncouple a flux device to a magnetometer or another device. However, the large gain that is needed creates the problem of imprecise balancing of the gradiometric loops of the transformer. This leads to inaccuracy in maintaining a specified coupling strength. Also, the transformer is rather large (150 μm×150 μm) and thus infeasible in systems with a large number of devices. Lastly, the transformer is bistable, or has two energy minima, which is not preferred for coupling flux devices together.

Another type of gradiometric flux transformer was considered in Cosmelli et al., 2004, arXiv.org:cond-mat/0403690, which is hereby incorporated by reference in its entirety. In Cosmelli et al., each arm of the gradiometer couples to one adjacent device, and the tunable element is a single compound junction in the central leg. Yet another if-SQUID coupler is described in Plourde et al., 2004, *Physical Review B* 70, 140501, which is hereby incorporated by reference in its entirety. In Plourde et al., the coupling is mediated through a current biased dc-SQUID. The dc-SQUID can be tuned to switch the sign of the coupling. However, such systems are expensive to fabricate and cannot provide full flexibility in adjusting the strength or sign of the coupling.

Coupling flux devices together using a Josephson junction galvanically connected to both flux devices has been proposed in Levitov et al., 2001, arXiv.org:cond-mat/0108266; and Butcher, 2002, Graduate Thesis, Delft University of Technology, each of which is hereby incorporated by reference in its entirety. Both references show a single large Josephson junction coupling a chain of three Josephson junction flux devices together. However, neither reference properly enables the operation of the coupling. Also, the type of coupling suggested in these references is always "on" and cannot be shut off.

2.6 State of the Art

As the above description indicates, there exist devices for coupling superconducting information devices together. However, improvement in the field is desired in order to realize cost effective quantum computing. Thus, there exists a need in the art to provide more control over the coupling between superconducting information devices. What is desired is coupling that would allow for the freedom to change the strength or sign of the coupling between superconducting information devices as well as the ability to altogether shut the coupling off when desired.

3. BRIEF DESCRIPTION OF THE DRAWINGS

Like reference numerals refer to corresponding parts throughout the several views of the drawings.

4. SUMMARY OF THE INVENTION

Figure 1A:
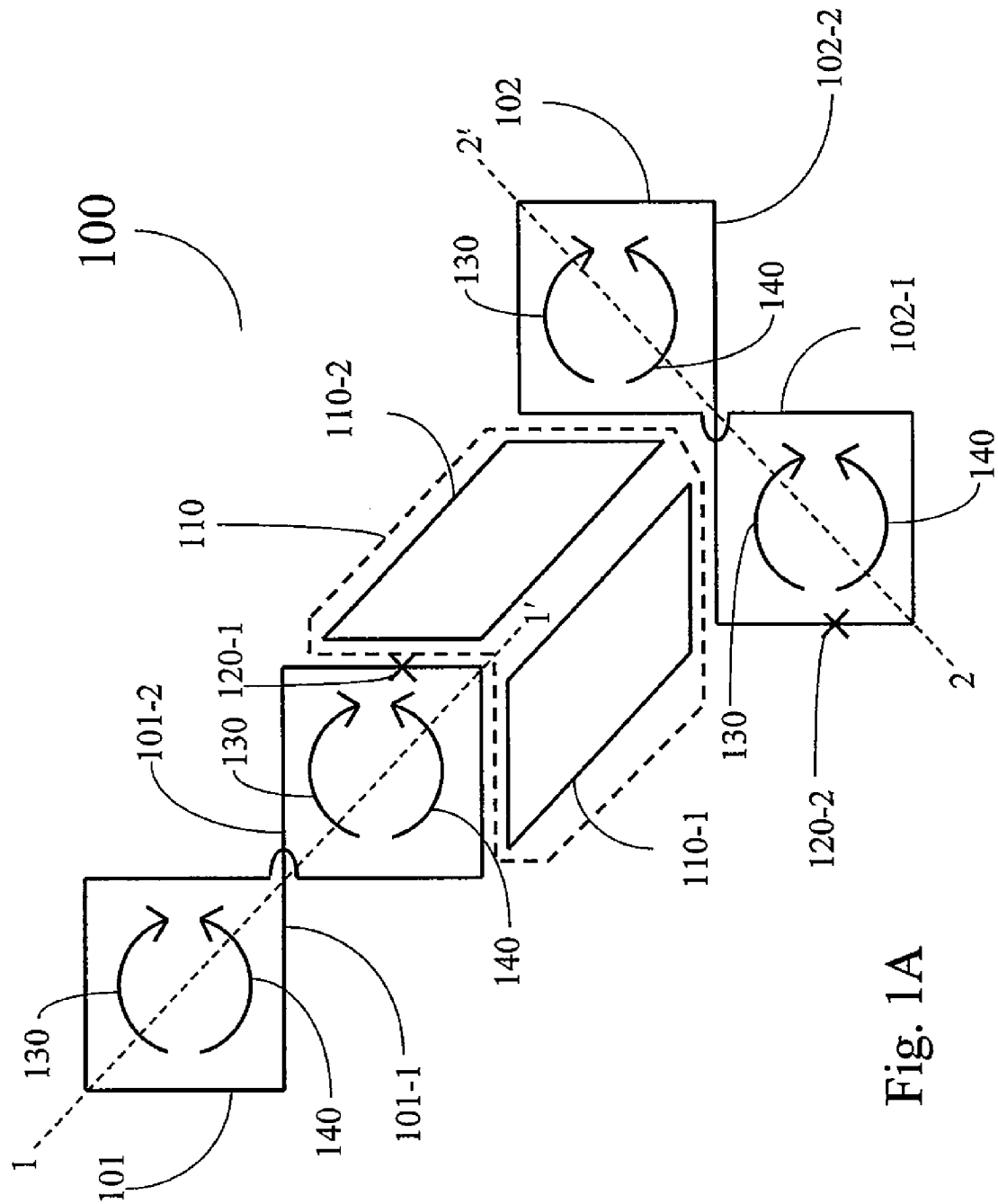
FIG. 1A illustrates two information devices in a dual coupling scheme in accordance with an embodiment of the invention.

One aspect of the present invention provides a structure comprising a first and a second flux device as well as a first and a second coupling element. The first flux device has at least a first lobe and a second lobe that are in electrical communication with each other. The second flux device has at least a first lobe and a second lobe that are in electrical communication with each other. The first coupling element inductively couples the first lobe of the first flux device to the first lobe of the second flux device. The second coupling element inductively couples the first lobe of the first flux device to the second lobe of the second flux device. The first and second coupling elements are not in electrical communication with each other. The first and second coupling element each have a dimensionless inductance that is between 0.5 and 2. In some embodiments, the first flux device and the second flux device are gradiometric flux devices.

In some embodiments, the at least first and second lobes of the first flux device and the at least first and second lobes of the second flux device each hold a different circulating current configuration. In some embodiments, the first coupling element or the second coupling element couples the first flux device to the second flux device ferromagnetically or antiferromagnetically. In one embodiment, the first coupling element has no coupling strength and the second coupling element has a finite coupling strength.

In some embodiments, the structure further comprises a switch dimensioned and configured relative to the first and second flux devices such that the switch can create a state in which both the first and second coupling elements have no coupling strength. In some embodiments, the structure further comprises a switch dimensioned and configured relative to the first and second flux devices such that the switch can toggle between a first state in which both the first and second coupling elements have a finite coupling strength and a second state in which both the first and second coupling elements have no coupling strength.

In some embodiments, the first coupling element, the second coupling element, or both the first coupling element and the second coupling element comprise a dc-SQUID. In some embodiments, the first coupling element, the second coupling element, or both the first coupling and second coupling elements comprise an rf-SQUID. In some embodiments, the structure further comprises means for controllably tuning the first coupling element, the second coupling element, or both the first and second coupling elements. In some embodiments, this switch comprises means for tuning the first and second coupling elements so that the first and second flux devices are not inductively coupled to each other. In some embodiments, the first and second flux devices are superconducting. In some embodiments, the dimensionless inductance of the first and second coupling elements is between 0.5 and 1.5. In other embodiments, the dimensionless inductance of the first and second coupling elements is approximately 1.

In some embodiments, the structure further comprises a plurality of flux devices, the plurality of flux devices comprising the first and second flux devices. Such embodiments further comprise a plurality of coupling devices. Each of one or more coupling devices in the plurality of coupling devices comprises a plurality of coupling elements. Furthermore, a first coupling device in the plurality of coupling devices comprises the first and second coupling elements described above. In some embodiments, the structure further comprises a second coupling device comprising third and fourth coupling elements as well as a third flux device comprising first and second lobes. In such embodiments, the third coupling element couples the first lobe of the first flux device with the first lobe of the third flux device and the fourth coupling element couples the second lobe of the first flux device with the first lobe of the third flux device.

In some embodiments, one or more flux devices in the plurality of flux devices is coupled to two, three, or four flux devices through different coupling devices in the plurality of coupling devices. In some embodiments, a Hamiltonian of a problem to be solved can be mapped onto the plurality of flux devices.

Another aspect of the present invention provides an apparatus comprising a first and a second information device as well as a coupling device comprising one or more coupling elements. The coupling device is configured to inductively couple the first and second information device devices together. The coupling device is further configured to switch the inductive coupling between ferromagnetic coupling and anti-ferromagnetic coupling of the first and second information devices in a controllable manner. Each coupling element in the coupling device has a dimensionless inductance that is between 0.5 and 2. In some embodiments, the one or more coupling elements consists of two coupling elements that are electrically insulated from each other. In some embodiments, the coupling device further comprises a switch for switching the inductive coupling between ferromagnetic coupling and anti-ferromagnetic coupling of the first and second information devices in a controllable manner. The switch comprises means for concurrently causing: (a) a first coupling element in the one or more coupling elements to go from (i) a first state in which the first coupling element has no coupling strength to (ii) a second state in which the first coupling element has a coupling strength, and (b) a second coupling element in the one or more coupling elements to go from (i) a third state in which the second coupling element has a coupling strength to (ii) a fourth state in which the second coupling element has no coupling strength.

In some embodiments, the first and second information devices are gradiometric flux devices. In some embodiments, each coupling element in all or a portion of the coupling elements in the one or more coupling elements comprises a dc-SQUID. In some embodiments, each coupling element in all or a portion of the coupling elements in the plurality of coupling elements comprise an rf-SQUID. In some embodiments, the coupling device comprises means for tuning the inductive coupling between the first and second information device on and off. In some embodiments, the coupling device comprises means for tuning a coupling strength of the inductive coupling between the first and second information device.

Yet another aspect of the present invention provides a method of switching a coupling between information two devices. In such embodiments, the two information devices are coupled to each other by a coupling device comprising coupling elements. In the method, a first coupling element in the coupling device is turned off. The first coupling element couples a first lobe of a first of the two information devices with a first lobe of the second of the two information devices. A second coupling element in the coupling device is turned off. The second coupling element couples the first lobe of the first of the two information devices with a second lobe of the second information devices. The first coupling element is initially on and the second coupling element is initially off. The first and second coupling elements are not in electrical communication with each other. Both coupling elements have a dimensionless inductance that is between 0.5 and 2.

In some embodiments, the step of turning off the first coupling element removes a first coupling between the first and second information devices. Furthermore, the step of turning on the second coupling element introduces a second coupling between the information devices. In some embodiments, the first coupling is ferromagnetic and the second coupling is anti-ferromagnetic. In other embodiments, the first coupling is anti-ferromagnetic and the second coupling is ferromagnetic.

Still another aspect of the present invention provides a method of removing a coupling between a first and a second information device. The first and second information devices are coupled to each other by a coupling device comprising coupling elements. In the method, a first coupling element in the coupling device is tuned. The first coupling element couples a first lobe of the first information device with a first lobe of the second information device. A second coupling element is tuned. The second coupling element couples the first lobe of the first information device with a second lobe of the second information device. The coupling produced by the tuning of the second coupling element cancels the coupling produced by the tuning of the first coupling element. The first and second coupling elements are not in electrical communication with each other. Both coupling elements have a dimensionless inductance that is between 0.5 and 2.

In some embodiments, the first coupling element is a dc-SQUID and the tuning of the first coupling or the tuning of the second coupling comprises tuning a current bias or a flux bias. In some embodiments, the first coupling element is an rf-SQUID, and the tuning of the first coupling or the tuning of the second coupling comprises tuning a flux bias. In some embodiments, the second coupling element is a dc-SQUID, and the tuning of the first coupling or the tuning of the second coupling comprises tuning a current bias or a flux bias. In some embodiments, the second coupling element is an rf-SQUID, and the tuning of the first coupling or the tuning of the second coupling comprises tuning a flux bias. In some embodiments, the first coupling element couples the first and second information devices together ferromagnetically, and the second coupling element couples the first and second information devices together anti-ferromagnetically.

Still another aspect of the invention provides a structure comprising a first and second flux device as well as a first SQUID coupler inductively coupled to the first and second flux devices. The first SQUID coupler is configured to provide ferromagnetic or anti-ferromagnetic coupling between the first and second flux devices. The SQUID coupler has a dimensionless inductance between 0.5 and 2. In some embodiments, the first flux device comprises a first loop of superconducting material interrupted by a first Josephson junction and the second flux device comprises a second loop of superconducting material interrupted by a second Josephson junction. In some embodiments, the first SQUID coupler is an rf-SQUID coupler. In some embodiments, the rf-SQUID coupler has a dimensionless inductance between 0.7 and 1. In some embodiments, the device further comprises a magnetic switch for applying a magnetic field to the rf-SQUID coupler. A field strength of the magnetic field determines whether an inductive coupling between the first and second flux devices is ferromagnetic or anti-ferromagnetic. In some embodiments, the magnetic field has a flux close to zero and the inductive coupling between the first and second flux devices is anti-ferromagnetic. In some embodiments, the magnetic field has a flux close to n and the inductive coupling between the first and second flux devicess is ferromagnetic. In some embodiments, the rf-SQUID coupler is monostable. In some embodiments, the structure further comprises a biasing switch configured to bias the if-SQUID coupler with a flux close to a number of quanta.

In some embodiments, the first SQUID coupler is a dc-SQUID coupler. The dc-SQUID coupler is configured to provide ferromagnetic or anti-ferromagnetic coupling between the first and second flux devices. In some embodiments, the dc-SQUID coupler is symmetric and is tuned by a flux bias device and current bias device. In some embodiments, the dc-SQUID coupler is asymmetric and is tuned by a flux bias device. In some embodiments, the structure further comprises a plurality of flux devices, the plurality of flux devices comprising the first and second flux devices as well as a plurality of SQUID couplers. Each SQUID coupler is inductively coupled to a different pair of flux devices in the plurality of flux devices and the plurality of SQUID couplers includes the aforementioned first SQUID coupler. Each SQUID coupler has a dimensionless inductance between 0.5 and 2. In some embodiments, each SQUID coupler in the plurality of SQUID couplers is configured to provide ferromagnetic or anti-ferromagnetic coupling between its respective pair of flux devices.

Another aspect of the present invention provides a structure comprising a first and second flux device with a first coupler galvanically coupled to each of the flux devices. The first coupler comprises a plurality of Josephson junctions and is configured to provide ferromagnetic or anti-ferromagnetic coupling between the flux devices. In some embodiments, the first and second flux device each comprise three Josephson junctions in a superconducting loop.

In some embodiments, the first coupler comprises three Josephson junctions in a superconducting loop as well as an external flux bias that can tune the flux through the superconducting loop. In some embodiments, the first flux device is galvanically connected across a first Josephson junction of the first coupler and the second flux device is galvanically connected across a second Josephson junction of the first coupler. The external flux bias can be tuned to provide zero coupling between the first and second flux devices and can tune the coupling from ferromagnetic to anti-ferromagnetic and vice versa.

In some embodiments, the first coupler comprises a first intersection between a first wire and a second wire, a second intersection between the first wire and a third wire, a third intersection between the second wire and a fourth wire, and a fourth intersection between said the wire and the fourth wire. Each wire comprises a Josephson junction and the second and third wires cross each other without forming an electrical contact. Each intersection is further in electrical communication with a current bias. In some embodiments, the second and third current bias are tuned to provide currents that are opposite to the currents provided by the first and fourth current bias and the coupling between the first and second flux device is ferromagnetic. In other embodiments, the third and fourth current bias are tuned to provide currents that are opposite to the currents provided by the first and second current bias and the coupling between the first and second flux device is anti-ferromagnetic. In some embodiments, the magnitude of the current provided by each current bias is equal.

In some embodiments, the structure further comprises a plurality of flux devices, where the plurality of flux devices includes the first and second flux device. The structure also comprises a plurality of couplers including the first coupler, with each coupler galvanically coupled to a different pair of flux devices in the plurality of flux devices. Each such coupler comprises a plurality of Josephson junctions. In some embodiments, each coupler in the plurality of couplers is configured to provide ferromagnetic or anti-ferromagnetic coupling between its respective pair of flux devices.

5. DETAILED DESCRIPTION

In accordance with the present invention, coupling devices for coupling information devices are provided. Such coupling devices are capable of tuning the coupling of information devices between an on (coupled) state and an off (uncoupled) state. The coupled state can be either ferromagnetic (negative) or anti-ferromagnetic (positive). The coupling devices can be controlled by any of a number of ways, including through a magnetic flux source or a current source, such that the above identified coupling regimes can be realized. In accordance with the present invention, an integrated circuit comprising many information devices and coupling devices is useful for computing solutions or approximate solutions to optimization problems. See, e.g., U.S. provisional patent application Ser. No. 60/638,600, entitled "Analog Processor with Quantum Devices," to Geordie Rose, filed Dec. 23, 2004 under attorney docket number 706700-888200 which is hereby incorporated by reference in its entirety.

In accordance with the present invention, an information device comprises a superconducting loop interrupted by one or more Josephson junctions. An information device is capable of storing binary information. In some embodiments of the present invention, the information devices are flux devices capable of storing and processing binary quantum information. As described above, flux devices are well known in the art. In some embodiments of the present invention, information devices and flux devices comprise the same basic components.

Coupling devices in accordance with the some embodiments of the present invention function in the on and off states independently of the nature of the information devices that they couple. Flux devices in accordance with some embodiments, of the present invention store binary information in the same manner as flux qubits, but differ from flux qubits in the sense that they do not need to store quantum information coherently for long periods of time. Removing the need for long coherence times reduces the constraints on device fabrication and improves chip yield.

In accordance with the present invention, the coupling devices operate over a range of temperatures. In order to maximize coherence times, superconducting devices are frequently operated in an ultra-low temperature environment, ranging from about 5 milli-Kelvin (mK) to about 70 mK. Such low temperatures reduce noise from the environment and hence facilitate coherent storage and processing of quantum information. In some embodiments of the present invention, one or more integrated circuits comprising a plurality of information devices and coupling devices (e.g., 10 or more information devices and associated coupling devices, 100 or more information devices and associated coupling devices, between 10 and 10,000 information devices and associated coupling devices, etc.) are operated at temperatures above those at which conventional superconducting devices are normally operated (about 5 mK to about 70 mK). For example, in some embodiments, the one or more integrated circuits are operated in an environment ranging from about 5 mK to about 4 K. When the information devices are operated within this temperature range, various quantum effects, such as incoherent quantum tunneling, are present and contribute to the computation. The operating temperature of the one or more integrated circuits is less than the critical temperature of the superconducting metals that make up the information devices and couplers of the integrated circuit. For example, aluminum or niobium can be used in such integrated circuits. These elements have critical temperatures of about 1.2 K and 9.3 K respectively. In some embodiments of the present invention, the information devices and/or couplers in the one or more integrated circuits are made from different superconducting materials, and the maximum temperature of operation is set by the information device and/or coupler that is made from a material having the lowest critical temperature.

In accordance with the present invention, novel structures and methods for the controllable coupling of superconducting flux devices are described in detail. In some embodiments of the invention, two superconducting quantum interference devices (SQUIDs) are used to couple two flux devices together in a tunable manner that permits switching of the coupling sign. The coupling sign dictates whether the coupling is ferromagnetic or anti-ferromagnetic. In an aspect of the invention, flux device arrays comprising a plurality of information devices (e.g., 10 or more information devices, 20 or more information devices, 30 or more information devices, 100 or more information devices, 300 or more information devices) in which all or a portion of the information devices in the plurality of information devices are coupled to at least one other information device in the plurality of information devices by a tunable coupling devices are presented. In an aspect of the invention, it is shown how to operate such coupling devices in order to switch coupling sign and, when desired, to shut off the coupling altogether.

In an embodiment of the present invention a coupler SQUID is used to couple two rf-SQUIDs. In such an arrangement, the rf-SQUIDs that are coupled by the coupler SQUID serve as information devices and are referred to as flux device rf-SQUIDS. The coupler SQUID can either be a dc-SQUID or an rf-S QUID. In an embodiment of the present invention, a coupler rf-SQUID is a monostable rf-SQUID or a bistable rf-SQUID. In an embodiment of the present invention, a coupler dc-SQUID is a symmetric dc-SQUID or an asymmetric dc-SQUID.

In an embodiment of the present invention, a coupling device with a plurality of Josephson junctions is used to galvanically couple two flux devices=. The coupling device provides either ferromagnetic or anti-ferromagnetic coupling between the flux devices, and is further configured to dictate the coupling strength between the flux devices. In some embodiments, the coupling device is tuned by an external flux bias and comprises a superconducting loop interrupted by three Josephson junctions. In some embodiments, the coupling device comprises four Josephson junctions arranged in a cross-wire design and is tuned by four external current biases.

A gradiometric flux device is a type of information device that is insensitive to homogenous magnetic fields applied over the device surface area. A gradiometric flux device comprises at least one loop of superconducting material interrupted by one or more Josephson junctions. Each of the at least one loops in the gradiometric flux device can comprise one or more lobes. Each lobe in a given loop is flipped with respect to adjacent lobes in the loop so that superconducting current flowing in the loop will circulate in one direction in one lobe and the opposite direction in another lobe. Each lobe in a gradiometric flux device can be in electrical communication with the other lobes, meaning that electrical current can flow from one lobe to another. A magnetic field threading a superconducting loop will induce current to flow in a direction that depends on the direction of the magnetic field. In the case where each loop of a gradiometric flux device has exactly two lobes forming a lobe pair and each of these lobe pairs are flipped with respect to each other, a magnetic field that is homogeneous across the flux device will act on both lobes of each lobe pair to induce circulating current in the same direction in both lobes of each lobe pair. The resulting currents in each lobe of each lobe pair oppose each other and hence cancel out, resulting in no total circulating current. Conversely, an inhomogeneous or asymmetric magnetic field will induce a stronger current in one lobe of a lobe pair, such that the resulting persistent currents do not cancel out, resulting in a net total circulating current. In the case where a gradiometric flux device has an even number of lobes, then currents caused by a homogenous magnetic field also all cancel each other out as described above. When a gradiometric flux device with an odd number of lobes is exposed to a homogenous magnetic field, then one or more external magnetic field biases are needed in order to cancel out all the currents. In an embodiment of the present invention, a gradiometric flux device with an even number of lobes is used as information device.

In some embodiments of the present invention, each information device has the gradiometric configuration described above. A gradiometric configuration is useful for controlling the coupling between information devices and for reducing noise-sensitivity across the integrated circuit. In some embodiments of the invention, each lobe of each information device in a plurality of information devices is fabricated on the same layer in a superconducting chip. In some embodiments of the invention, each lobe is fabricated on the same layer in a superconducting chip but the crossover (the area where the lobes are flipped relative to each other) is fabricated on another layer, which can be useful in balancing the inductances of the lobes. In some embodiments of the invention, each lobe is fabricated in separate layers such that one lobe from each information device is fabricated on one layer of a superconducting chip, while the other lobe is fabricated on a different layer of the chip. In accordance with an embodiment of the present invention, gradiometric information devices are operated in environments with a temperature ranging between about 5 mK and about 4 K. The operating temperature of the integrated circuit is less than the critical temperature of the superconductors that make up the integrated circuit.

FIG. 1A shows an embodiment of the present invention for coupling two superconducting information devices using coupling device 110. In FIG. 1, coupling device 110 comprises two coupling elements 110-1 and 110-2 that are not in electrical communication with each other. This novel type of coupling, comprising two coupling elements like in FIGS. 1 and 2, is referred to herein as the dual coupling scheme. In some embodiments, information devices 101 and 102 are flux devices, and may have the same structure and size. In some embodiments of the invention, while information devices 101 and 102 have similar structures and sizes, they are not identical due to fabrication imperfections. In some embodiments of the present invention, information devices 101 and 102 are gradiometric flux devices. In some embodiments of the present invention, other types of information devices 101 and 102 can be used. Information devices 101 and 102 in FIG. 1A illustrate one embodiment of a gradiometric flux device, in which each device has one loop comprising two lobes (lobes 101-1 and 101-2 in information device 101, as well as lobes 102-1 and 102-2 in information device 102). Information devices 101 and 102 have only one loop since the corners of the lobes are not electrically connected where they meet in FIG. 1. As illustrated in FIG. 1, the loop in information device 101 and the loop in information device 102 is interrupted by a Josephson junction 120, denoted by an X. The location of the Josephson junction in each loop can vary from information device to information device on a single chip and between chips. In some embodiments of the present invention, the information devices comprise more than one Josephson junction.

Information devices 101 and 102 are coupled by coupling device 110 that is placed diagonally between flux devices 101 and 102 as shown in FIG. 1A. Coupling device 110 applies an inductive coupling between information devices 101 and 102. In some embodiments of the present invention, coupling device 110 comprise a plurality of SQUIDs, such as dc-SQUIDs or rf-SQUIDs. Each element (e.g., rf-SQUID or dc-SQUID) within coupling device 110 can be operated independently of the others.

Using both elements 110-1 and 110-2, information devices 101 and 102 can be controllably coupled. When coupling device 110 comprises dc-SQUIDs, controllable coupling can be obtained by applying a bias current to each respective coupling element (here each respective coupling dc-SQUID) or by changing the magnetic flux within the respective coupling element loops. When coupling device 110 comprises rf-SQUIDs, controllable coupling is achieved by changing the magnetic flux within the SQUID loop of each respective coupling element. In some embodiments, one coupling element in coupling device 110 is a dc-SQUID while the other coupling element is an rf-SQUID. In such embodiments, controllable coupling is achieved by applying a bias current or by changing the magnetic flux of the dc-SQUID and by changing the magnetic flux within the SQUID loop of the rf-SQUID.

Figure 1C:
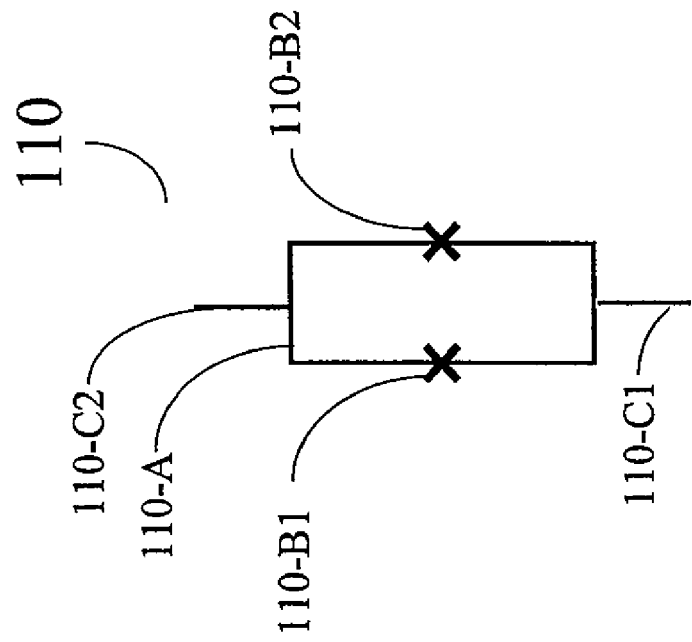
FIGS. 1B and 1C illustrate coupling devices or coupling elements in accordance with embodiments of the present invention.
Figure 1B:
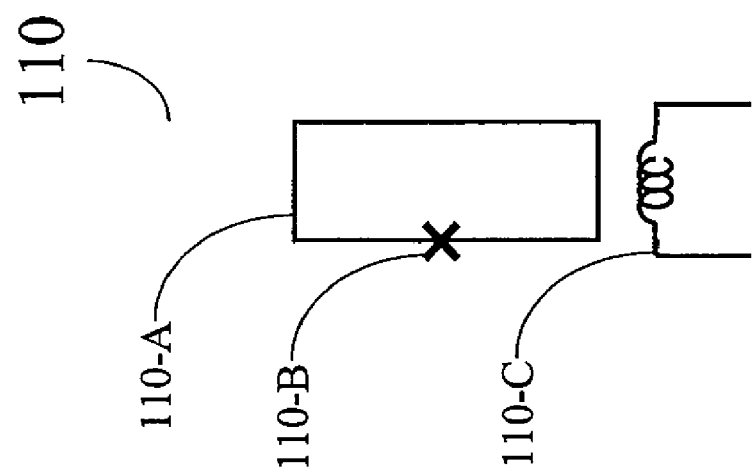
Figure 2:
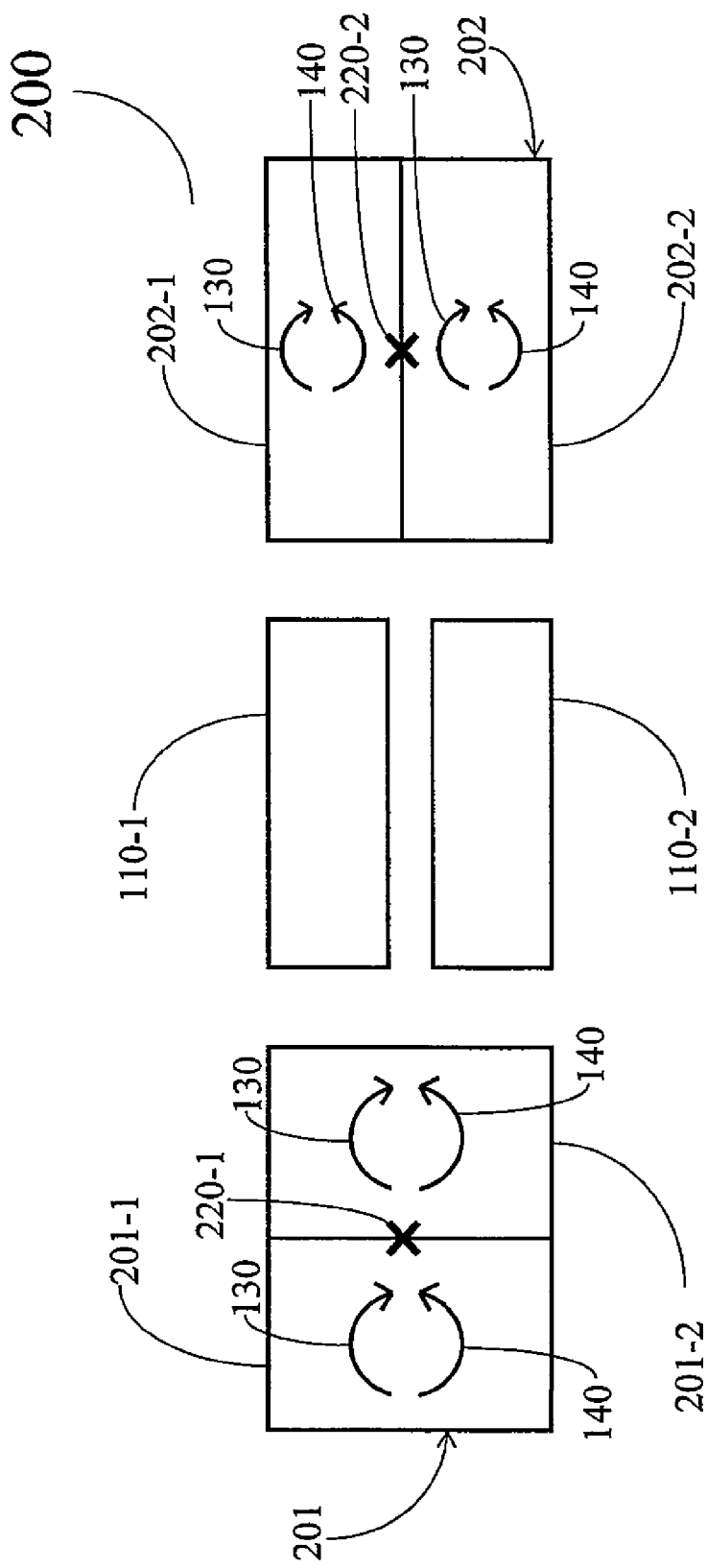
FIG. 2 illustrates two information devices in a dual coupling scheme in accordance with another embodiment of the present invention.

Exemplary coupling elements 110 in accordance with some embodiments of the present invention are illustrated in FIGS. 1B and 1C. In FIG. 1B, an exemplary coupling element 110 comprises an rf-SQUID that includes a loop of superconducting material 110-A interrupted by Josephson junction 110-B. In the embodiment illustrated, controllable coupling is realized by controlling the magnetic flux through the rf-SQUID. The coupling element 110 of FIG. 1B further includes a flux bias source 110-C for threading magnetic flux through loop 110-A. In some embodiments, flux bias source 110-C comprises a loop of metal placed such that it is inductively coupled to superconducting loop 110-A. The coupling state of the coupling element can be controlled by varying the current in flux bias source 110-C. When a current is applied to flux bias source 110-C a magnetic field results that threads superconducting loop 110-A. In some embodiments, the magnetic flux is useful for controlling the coupling state of coupling element 110 of FIG. 1B. In an embodiment of the present invention, the magnetic flux ranges from $-\Phi_0$ to $+\Phi_0$, where $\Phi_0$ is the flux quantum. In some embodiments, magnetic flux useful for controlling coupling element 110 of FIG. 1B ranges from about $-10*\Phi_0$ to about $+10*\Phi_0$. The flux required to control coupling element 110 of FIG. 1B depends on the characteristics of the device, such as the size of superconducting loop 110-A and the properties of Josephson junction 110-B. In some embodiments, superconducting loop 110-A has a size ranging from about 1 square micron to about 10,000 square microns. In some embodiments, Josephson junction 110-B has a size ranging from about 0.1 microns to about 50 microns. In some embodiments, superconducting loop 110-A is made out of niobium. In some embodiments, superconducting loop 110-A is made of aluminum. In some embodiments, superconducting loop 110-A is made of a superconductor fabricated on a silicon substrate.

FIG. 1C illustrates another coupling element 110 in accordance with the present invention. The coupling element 110 of FIG. 1C comprises a DC-SQUID that includes a loop of superconducting material 110-A interrupted by two Josephson junctions 110-B1 and 110-B2. The coupling element 110 of FIG. 1C further includes two bias leads 110-C1 and 110-C2 for applying a bias current through the coupling element 110. In some embodiments, the characteristics of the coupling element 110 of FIG. 1C are substantially the same as those of the coupling element 110 of FIG. 1B. Josephson junctions 110-B1 and 110-B2 can be the same size as Josephson junction 110-B or different. The coupling element 110 of FIG. 1C can be controlled by applying a bias current across leads 110-C1 and 110-C2 and also by a flux bias (which is not shown) similar to 110-C of FIG. 1B.

In some embodiments of the present invention, bias current magnitudes useful for controlling the coupling of dc-SQUIDs of the present invention ranges from about 1 picoamperes (pA) to about 10 milliamperes (mA). One characteristic of Josephson junctions 110-B1 and 110-B2 is their critical current. The critical current of a Josephson junction is the magnitude of current beyond which the junction begins to break Cooper pairs. The critical current of a Josephson junction is also defined as the minimum current at which a resistance arises across the junction and, conversely, below which the junction is superconducting and has near-zero resistance. In some embodiments of the present invention, the bias current applied is less than the critical current of Josephson junctions 110-B1 and 110-B2.

Each coupling element 110 of FIG. 1 has a dimensionless inductance, $\beta=2\pi L I_c/\Phi_0$, here L is the inductance of the element, $I_c$ is the critical current of the element, and $\Phi_0$ is the flux quantum. The dimensionless inductance can also be written as $\beta=L/L_j$, where $L_j=\Phi_0/2\pi I_c$ is called the Josephson inductance. The value of the dimensionless inductance determines the whether or not the coupling element 110 is monostable ($\beta<1$) or bistable ($\beta>1$). Monostability means that the potential energy of the coupling element 110 only has one minimum, whereas bistability means that the potential energy has two minima. For the purposes of coupling, it is preferable that coupling elements 110 are not bistable in the present invention. However, the lower $\beta$ is, the lower the coupling strength, so $\beta$ should not be much less than 1. In some embodiments of the present invention, the dimensionless inductance of coupling elements 110 is between 0.5 and 2. In some embodiments of the present invention, the dimensionless inductance of coupling elements 110 is between 0.7 and 1.5. In some embodiments of the present invention, the inductance of coupling elements 110 is on the same order as their Josephson inductances, which means the dimensionless inductance is approximately one. In an embodiment of the present invention, the first and second information devices have dimensionless inductances greater than one.

Referring to FIG. 1A, in one embodiment of the present invention, coupling device 110 is in close enough proximity to lobe 101-2 of information device 101 to couple to the lobe.

Coupling element 110-1 is in close proximity to lobe 102-1 of information device 102 while coupling element 110-2 is in close proximity to lobe 102-2 of information device 102. Herein, elements or devices are in close proximity to each other when the distance between the elements or devices (e.g., SQUIDs or loops of SQUIDS) is such that the coupling strength between the two elements or devices is non-negligible. A coupling strength is considered non-negligible when it can be measured using conventional measuring devices. In FIG. 1A, coupling device 110 is coupled to the same lobe of information device 101 but different lobes of information device 102. In some embodiments of the present invention, the couplings between the coupling elements of coupling device 110 and the information device lobes are all anti-ferromagnetic. However, there is no requirement that such couplings be all anti-ferromagnetic. In some embodiments, the coupling between information devices 101 and 102 can be either ferromagnetic or anti-ferromagnetic.

As noted above, in some embodiments, information devices 101 and 102 are gradiometric flux devices. In some embodiments, gradiometric flux devices that can be used in quantum computing architectures such as disclosed in FIG. 1A have two configurations in each lobe. Using FIG. 1A for reference, these configurations correspond to clockwise 130 and counterclockwise 140 currents circulating around each lobe. The direction that clockwise 130 or counterclockwise 140 current would flow, when present, is shown in each lobe of the information devices depicted in FIG. 1A. However, illustration of the direction of such currents is not to be construed to mean that such currents are always present in these lobes.

Information devices 101 and 102 in FIG. 1A have different current configurations in each lobe, since the information devices are made of one loop of superconducting material. For example, in information device 101, lobe 101-1 can have clockwise circulating current 130 while lobe 101-2 has counterclockwise circulating current 140, or vice versa. Conversely, for example, in information device 101, lobe 101-1 can have counter-clockwise circulating current 140 while lobe 101-2 has clockwise circulating current 130. The same applies to information device 102. Thus, by using coupling elements 110, lobe 101-2 of information device 101 can be coupled to a lobe of information device 102, which either has the same or opposite direction of circulating current. Depending on whether the coupled current directions are the same or opposite, ferromagnetic or anti-ferromagnetic coupling is achieved. For example, consider the case in which lobe 101-2 has a clockwise 130 circulating current configuration and thus lobe 101-1 has counterclockwise 140 circulating current. Further, in some embodiments, lobe 102-1 has clockwise 130 circulating current and lobe 102-2 has counterclockwise 140 circulating current. Thus, when coupling element 110-1 is turned on while coupling element 110-2 is turned off, information device 101 is ferromagnetically coupled to information device 102. When, on the other hand, coupling element 110-2 is on while coupling element 110-1 is off, then flux device 101 is anti-ferromagnetically coupled to information device 102. Thus, in this manner, switching the on/off status of coupling elements 110-1 and 110-2 can effect switching of the coupling type of information devices 101 and 102 between anti-ferromagnetic coupling and ferromagnetic coupling, and vice versa.

In the example above, coupling elements in coupling device 110 can also be biased in such a way that coupling element 110-1 provides anti-ferromagnetic coupling and coupling element 110-2 provides ferromagnetic coupling. In some embodiments of the present invention, coupling device 110 can be biased so that both elements provide only either ferromagnetic or anti-ferromagnetic coupling.

In preferred embodiments, when both coupling elements 110-1 and 110-2 are off, information devices 101 and 102 are not coupled to each other. Information devices 101 and 102 can share some flux through their lobes, but the general orthogonality of the information devices in FIG. 1, illustrated by lines 1-1' and 2-2', prevents coupling between them. For example, lobe 101-2 in information device 101 can be inductively coupled directly to lobes 102-1 and 102-2. The strength of this coupling is approximately proportional to $r^{-2}$, where r is the inter-lobe distance. Here, inter-lobe distance between two lobes is defined as the distance between the centers of the two lobes. When the coupling strength of coupling device 110 is set to zero, lobe 101-2 will be anti-ferromagnetically coupled to both lobes of information device 102. However, these two couplings are equal in strength and therefore cancel each other out resulting in a net coupling strength of zero, assuming that the physical parameters of information devices 101 and 102 are the same. However, due to differences in the physical parameters of information devices 101 and 102 (e.g., arising, for example, as a result of imperfections in device fabrication), the coupling between information device 101-2 and one lobe of flux device 102 might be slightly stronger than the coupling between lobe 101-2 and the other lobe of information device 102. Consequently an appreciable residual coupling may exist between devices 101 and 102. This residual coupling can be made smaller by spacing devices 101 and 102 farther apart, thereby increasing r.

When both coupling elements 110-1 and 110-2 are on, coupling cancellation is also possible. In this case, coupling device 110 will facilitate ferromagnetic and anti-ferromagnetic couplings. These couplings can be tuned so that they are of equal strength and can thus be cancelled out. Tuning a coupling comprises tuning the individual the coupling elements, which can be SQUIDS in some embodiments of the present invention. This tuning can also work when the flux devices are not exactly the same (e.g. due to imperfections in fabrication). In the case where the couplings are not exactly equal, a small residual coupling can exist between the flux devices. In some embodiments of the present invention, the coupling device 110 is biased in such a way as to cancel out all residual coupling in the system and therefore leave information devices 101 and 102 completely uncoupled. In other words, the strength of coupling device 110 can be tuned to cancel out the residual coupling described above.

Coupling elements 110-1 and 110-2 can also be on for reasons other than coupling cancellation. In some embodiments of the present invention, when both coupling elements are on, one coupling element can be used to couple information devices 101 and 102, while the other coupling element can be used to induce a local magnetic field that can be used to bias one of the information devices. In some embodiments of the present invention, coupling device 110 can also be used to read out the state of an information device to which it is coupled.

In some embodiments of the present invention, the coupling strength between information devices 101 and 102 is tunable. That is, by changing bias conditions on either coupling element 110-1 or 110-2, the strength of the ferromagnetic or anti-ferromagnetic coupling between information devices 101 and 102 can be adjusted. In the Hamiltonian of system 100, $\sigma_z \otimes \sigma_z$ represents the "sigma z" coupling between information devices 101 and 102 and J is a pre-factor that indicates the strength of the interaction between information devices 101 and 102. When J>0, the coupling between information devices 101 and 102 is anti-ferromagnetic, with a higher J meaning a stronger anti-ferromagnetic coupling. When J<0, the coupling between flux devices 101 and 102 is ferromagnetic, with a lower J meaning a stronger ferromagnetic coupling. When J=0, coupling devices 110 provide no additional coupling between information devices 101 and 102. In some embodiments of the present invention, the coupling strength of coupling devices can be continuously or nearly continuously varied from J=1 to J=−1 by appropriate tuning of coupling device 110.

Coupling elements 110-1 and 110-2 can also inductively couple to each other. However, such coupling is negligible to operation of system 100. In some embodiments of the present invention, coupling elements 110-1 and 110-2 are fabricated in order to minimize inductive coupling between them.

FIG. 2 shows another embodiment of the present invention. In some embodiments in accordance with FIG. 2, information devices 201 and 202 of system 200 are flux devices. In fact, in FIG. 2, information devices 201 and 202 are depicted as gradiometric flux devices and are arranged in a regular grid pattern rather the diagonal pattern of FIG. 1. Information devices 201 and 202 both have two lobes that each hold a circulating current configuration and at least one Josephson junction 220. The direction that clockwise 130 or counter-clockwise 140 current would flow, when present, is shown in each lobe of the device depicted in FIG. 2. However, illustration of the direction of such currents is not to be construed to mean that such current is always present in these lobes.

Information devices 201 and 202 differ from the information devices of FIG. 1 in that information devices 201 and 202 are not made from one continuous loop. Instead, in both information device 201 and 202, a central leg, which includes at least one Josephson junction 220, connects two opposite points on a loop. Thus, in information device 201, there is no constraint imposed on the direction of current flow in lobe 201-1 relative to lobe 201-2. Likewise, in information device 202, there is no constraint imposed on the direction of current flow in 202-1 relative to lobe 202-2. In contrast, in the lobes of information devices 101 and 102, current can only flow in opposite directions in their two lobes. In some embodiments of the present invention, the central leg of each information device (201 and 202) comprises a dc-SQUID that includes two Josephson junctions.

In a preferred embodiment of the present invention in accordance with FIG. 2, information devices 201 and 202 have currents that flow in opposite directions in their respective lobes. That is, each information device has opposing currents in its two lobes, which can be used to represent the eigenstates, or quantum states, of the information device. Since the physical states of system 200 have currents of this form, a dual coupling scheme can be applied to this type of information device as described below.

Coupling elements 110-1 and 110-2 couple flux devices 201 and 202 together. The operation of system 200 is equivalent to that of the system depicted in FIG. 1. That is, when lobes 202-1 and 202-2 have opposite current configurations, lobe 201-2 can be ferromagnetically or anti-ferromagnetically coupled to flux device 202. This is done by switching the coupling elements 110-1 and 110-2 on or off as described previously in conjunction with FIG. 1.

It can be appreciated that flux devices other than flux device 101 or flux device 201 can be used in the dual coupling scheme presented above. In a preferred embodiment of the present invention, the type of information device used in the dual coupling scheme is a gradiometric flux device. In some embodiments of the present invention, the information device used in the dual coupling scheme is another type of flux device. It can also be appreciated that the shape of coupling elements 110-1 and 110-2 is not restricted to the shapes depicted in FIGS. 1 and 2.

Figure 3:
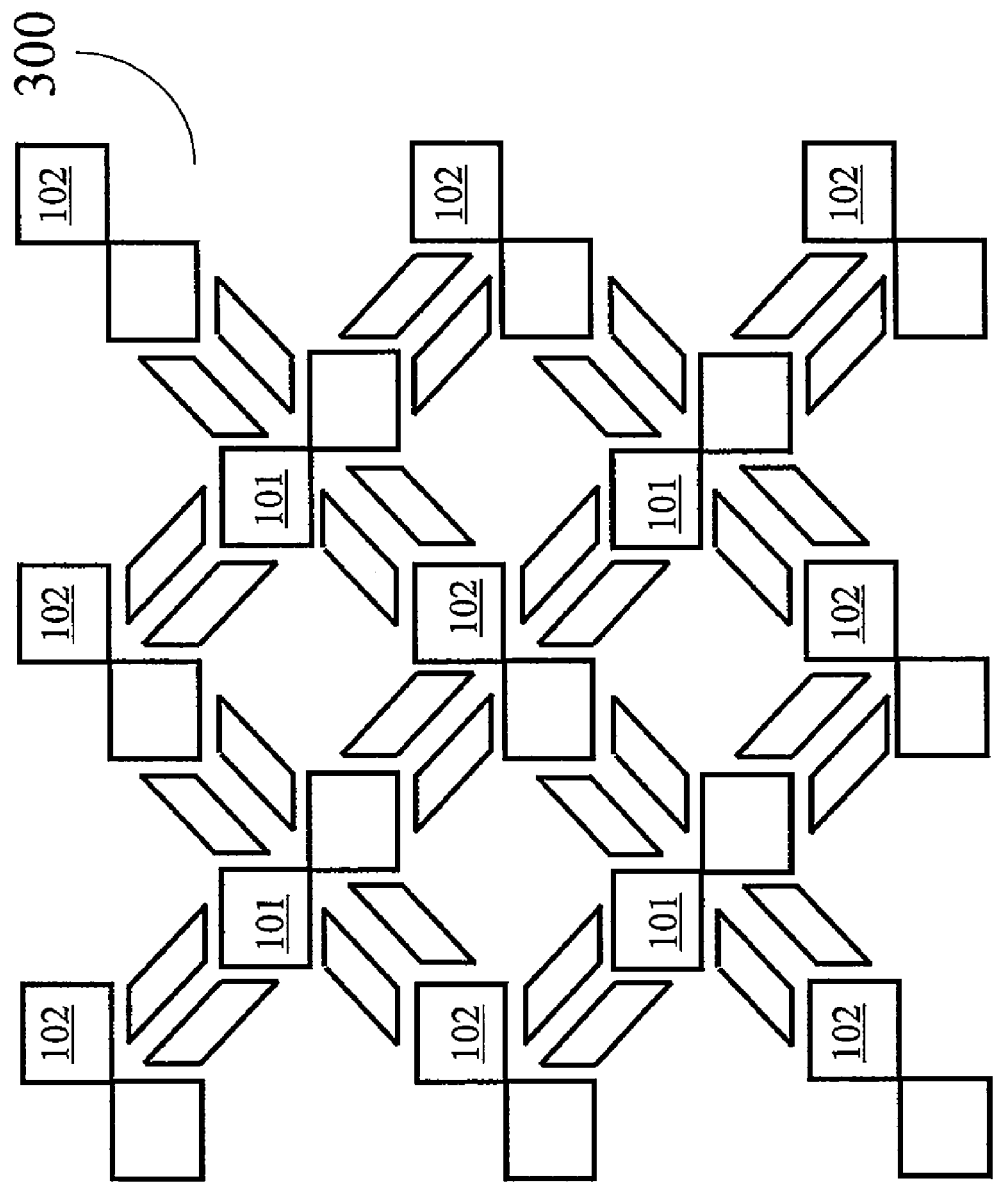
FIG. 3 illustrates a two-dimensional array of information devices that are coupled to each other using a dual coupling scheme in accordance with an embodiment of the present invention.

FIG. 3 shows a schematic integrated circuit of a two-dimensional (2D) array 300 of information devices 101 and 102 coupled to their nearest neighbors using the dual coupling scheme described above in conjunction with FIG. 1. Array 300 is an expansion of system 100 of FIG. 1. Information devices 101 and 102 in array 300 are depicted as gradiometric flux devices, but other flux devices can be used as well. Each device in the interior of the array is coupled to four neighboring devices. In accordance with the present invention, by switching the different coupling elements on and off, a device in array 300 can ferromagnetically or anti-ferromagnetically couple to any one of its neighbors. In some embodiments of the present invention, a Hamiltonian of a problem to be solved can be mapped onto the array of devices. Array 300 can thereby simulate the Hamiltonian and provide information about or a solution to the problem. In some embodiments of the present invention, array 300 is designed to solve only one Hamiltonian.

Figure 4:
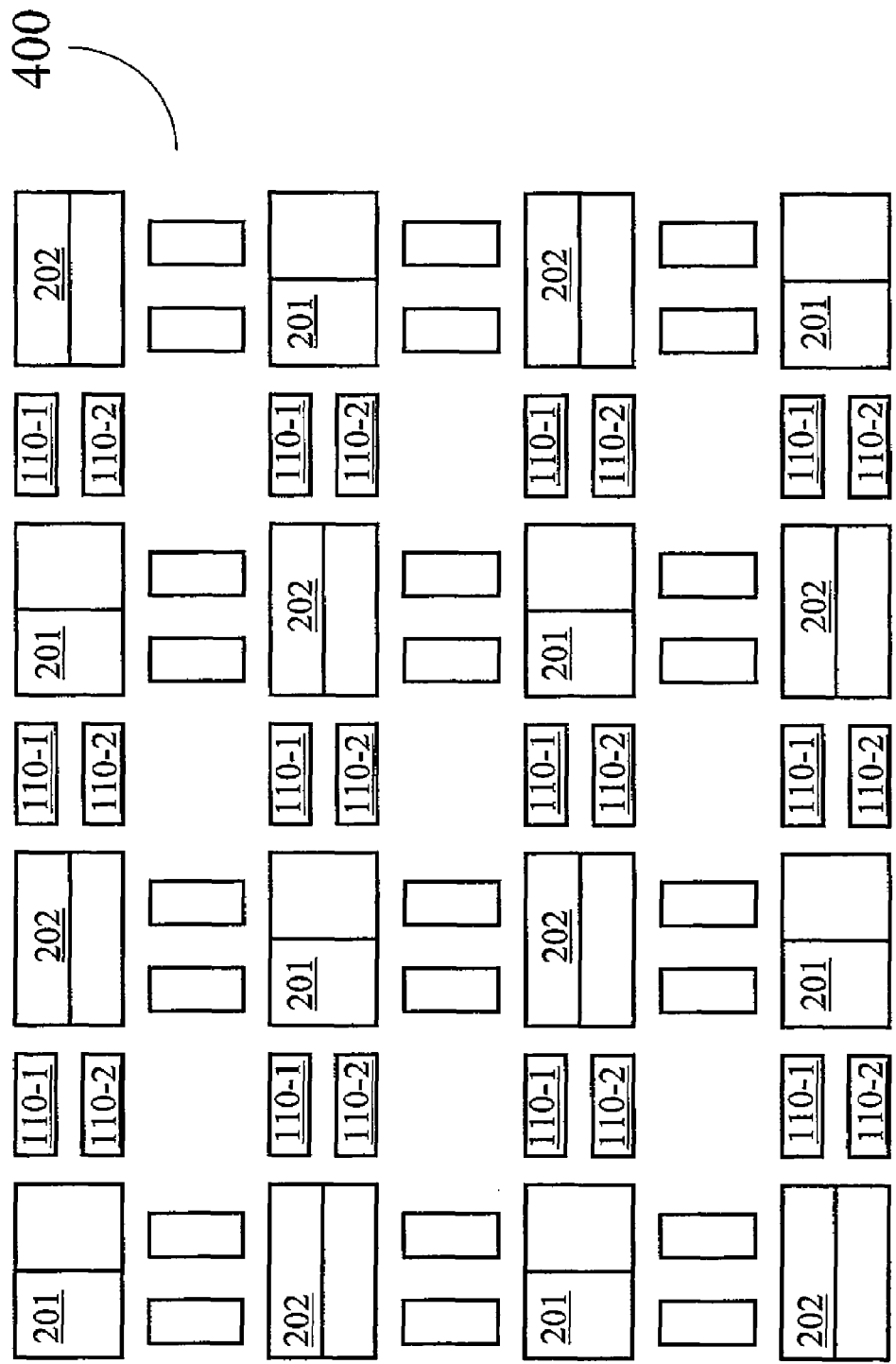
FIG. 4 illustrates a two-dimensional array of information devices that are coupled to each other using a dual coupling scheme in accordance with another embodiment of the present invention.

FIG. 4 shows a 2D array 400 of information devices coupled together using the dual coupling scheme described above in conjunction with FIG. 2. Array 400 is an expansion of the system depicted in FIG. 2 and operates in the same way. Each device in the interior of array 400 can be coupled ferromagnetically or anti-ferromagnetically to all four of its nearest neighbor devices.

It can be appreciated that while arrays 300 and 400 are specific embodiments of 2D arrays of information devices that employ the dual coupling scheme described above, other types of arrays are possible. For example, in an embodiment of the present invention, a 2D array of information devices with dual coupling to three nearest neighbors is possible. In some embodiments of the present invention, the number of coupled neighbors is greater than four. In some embodiments of the present invention, the array is a linear array and each information device is coupled to its two nearest neighbors. In some embodiments, the 2D array of information devices, such as those illustrated in FIGS. 3 and 4, comprise between ten and ten thousand devices, more than fifty devices, more than 100 devices, or less than two thousand devices.

Tunable Flux Transformers

In an aspect of the present invention, coupling devices for coupling information devices ferromagnetically and anti-ferromagnetically comprise only one coupling element. In particular, a monostable rf-SQUID or a dc-SQUID can mediate an inductive coupling between two adjacent information devices. The nontrivial dependence of the SQUID's susceptibility on external flux makes it possible to continuously tune the induced coupling from anti-ferromagnetic to ferromagnetic. In particular, for suitable parameters, the induced ferromagnetic coupling can be sufficiently large to overcome any possible direct anti-ferromagnetic inductive coupling between the information devices. In some embodiments of the present invention, a single rf-SQUID or a single dc-SQUID is used to couple two information devices together in a way that allows the type of coupling to be switched from ferromagnetic to anti-ferromagnetic or vice versa. In some embodiments of the present invention, the information devices are flux devices, such as rf-SQUIDs or persistent current qubits.

Figure 5:
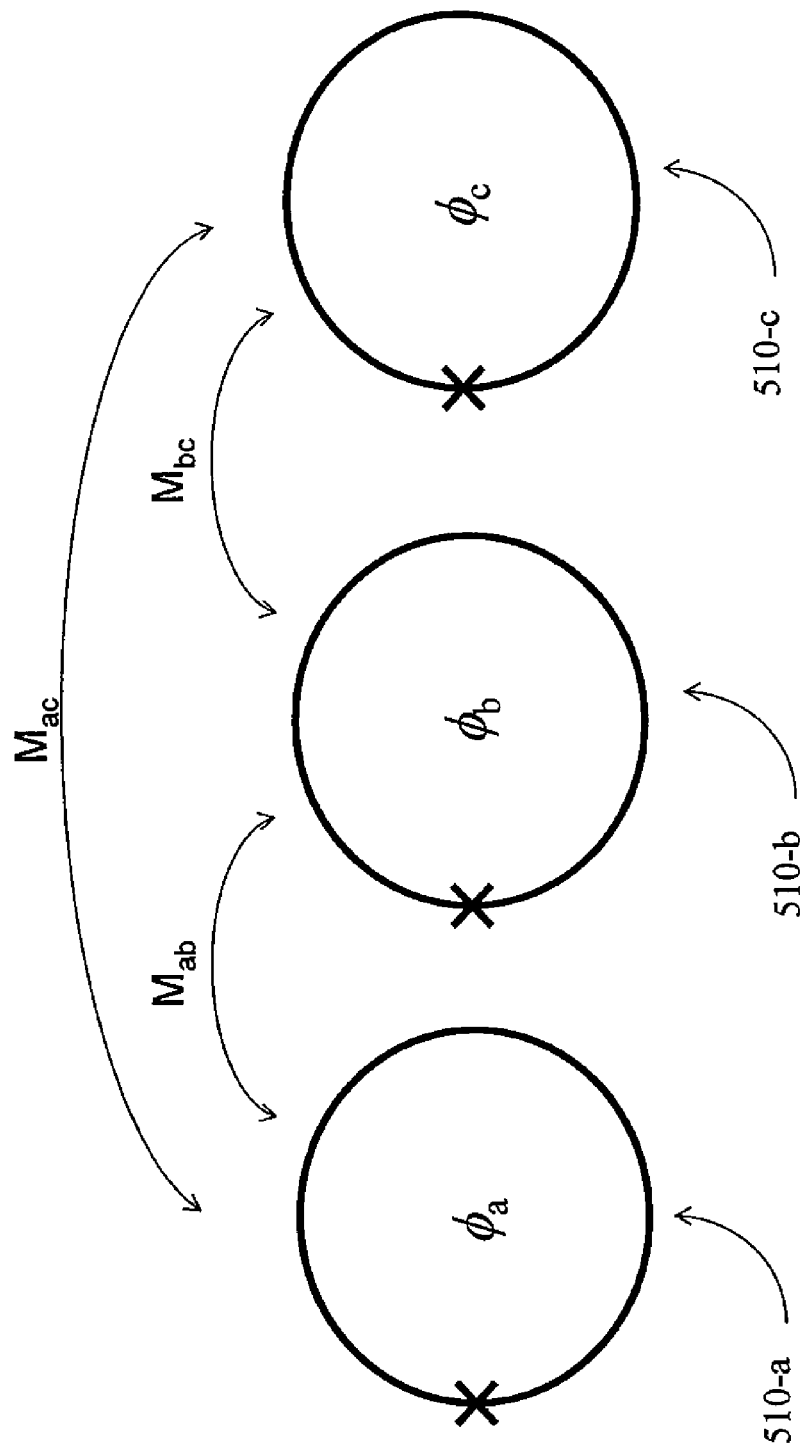
FIG. 5 illustrates a tunable coupling between flux devices using an rf-SQUID in accordance with an embodiment of the present invention.

FIG. 5 illustrates three rf-SQUIDs 510-a, 510-b, and 510-c. Each rf-SQUID consists of a loop of superconducting material interrupted by a Josephson junction (denoted by an X in the loop). These rf-SQUIDs are depicted in a row for convenience. In FIG. 5, rf-SQUID 510-*b* is a controllable coupling switch and is disposed between rf-SQUID 510-*a* and rf-SQUID 510-*c*. In an embodiment of the present invention, if-SQUID 510-*b* can be replaced with a general coupling switch or coupling device for controlling the coupling interaction between rf-SQUIDs 510-*a* and 510-*c*. An example of a general coupling switch is a flux transformer. The rf-SQUIDs couple to each other inductively. In some embodiments of the present invention, rf-SQUIDs 510-*a* and 510-*c* are used as information devices. The rf-SQUIDs 510 have circulating superconducting current as well as associated flux, which can be labeled by its direction, such as ↓ and ↑.

In embodiments of the present invention, rf-SQUID 510-*b* is monostable, meaning that the potential energy of the rf-SQUID only has one minimum. This can be achieved either by biasing rf-SQUID 510-*b* with a flux close to an integer number of quanta for a dimensionless inductance less than a critical value defined by the Josephson junction of rf-SQUID 510-*b* or for any flux bias by making rf-SQUID 510-*b* such that the dimensionless inductance is around 1 or less than 1. The dimensionless inductance is defined as $\beta_b=4e^2L_bE_b$ (here, $\hbar=1$; in SI units, $\beta=2\pi LI_c/\Phi_0$), where $L_b$ is the inductance and $E_b$ is the Josephson energy of rf-SQUID 510-*b*. This value of the dimensionless inductance can be achieved by reducing $E_b$ while keeping the area of the loop of rf-SQUID 510-*b*, and hence the inductive coupling, appreciable. The inductive coupling is considered appreciable when it produces a measurable effect on a device coupled to it. In some embodiments of the present invention, the area of the loop of rf-SQUID 510-*b* ranges from about 1 square micron to about 10,000 square microns. Reducing $E_b$ corresponds to reducing the critical current of rf-SQUID 51-*b*. For example, reduction in the critical current can be accomplished by reducing its critical current density during manufacturing, or by reducing the cross-sectional area of the Josephson junction in the rf-SQUID. In some embodiments, the critical current of the rf-SQUID is between about 1 pA and about 10 mA. When required, a shunting capacitance can be placed across the Josephson junction in rf-SQUID 510-*b* to keep the rf-SQUID in the flux regime.

In an embodiment of the present invention, rf-SQUID 510-*b* has a dimensionless inductance slightly less than one to ensure monostability and a strong coupling. In an embodiment of the present invention, rf-SQUID 510-*b* has a dimensionless inductance between 0.7 and 1. In another embodiment of the present invention, rf-SQUID 510-*b* has a dimensionless inductance between 0.8 and 1. In yet another embodiment of the present invention, rf-SQUID 510-*b* has a dimensionless inductance between 0.5 and 2. In another embodiment of the present invention, rf-SQUID 510-*b* has a dimensionless inductance between 0.9 and 1.1. In an embodiment of the present invention, rf-SQUIDs 510-*a* and 510-*c* have dimensionless inductances greater than 1 but less than 2.

Figure 6:
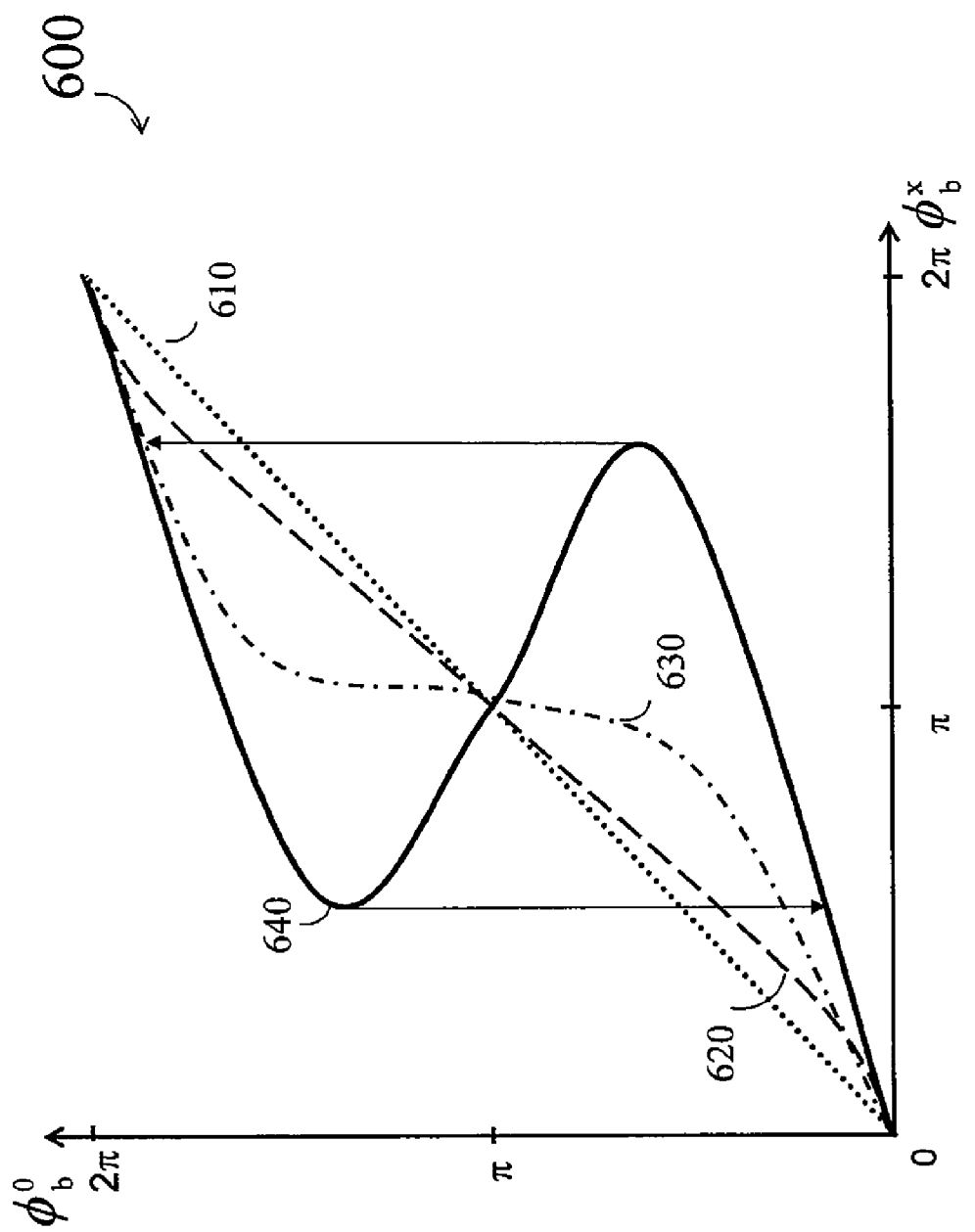
FIG. 6 is a graph of the total flux of an rf-SQUID versus the applied external flux in accordance with an embodiment of the present invention.

FIG. 6 shows a graph 600 modeling the total flux of an rf-SQUID, such as rf-SQUID 510-*b*, versus the applied external flux ($\phi_b^0$ versus $\phi_b^x$). Such a graph is hereinafter named the S-curve. The axes of FIG. 6 are in dimensionless phase units, $\phi$, and this is expressed in terms of the applied magnetic flux as $\phi=2\pi*(\Phi/\Phi_0)$, where $\Phi$ is the applied external flux or total flux depending on the respective axis of FIG. 6. The external flux is applied to the rf-SQUID loop, and the difference between the total and external flux is manifested by the current in the rf-SQUID. For example, curve 610 corresponds to the case where inductance is zero ($\beta_b=0$), and is a 45 degree line as expected for an open loop.

Curve 620 in FIG. 6 represents the case in which inductance of rf-SQUID 510-*b* is significantly less than 1 ($\beta_b \ll 1$) but is not zero. If flux device 510-*a* flips from ↑ to ↓, then, due to the mutual inductance between SQUIDs 510-*a* and 510-*b*, this effectively increases the external flux of rf-SQUID 510-*b*. For an external flux near zero, the S-curve has slope less than one so that this increase gets partially shielded by rf-SQUID 510-*b*'s self-flux in the ↓ direction. Thus, in such circumstances, rf-SQUID 510-*b* acts as a ↑-bias for flux device 510-*c*. Thus if-SQUID 510-*b* provides anti-ferromagnetic coupling between rf-SQUIDs 510-*a* and 510-*c* in this case. When, in contrast, the external flux of rf-SQUID 510-*b* is close to $\Phi_0/2$, the physical properties of rf-SQUID 510-*b* work in the opposite manner. There, the S-curve has slope greater than 1 (see curve 620 of FIG. 6) so that the self-flux does not shield at all but actually cooperates with the increase in external flux. Thus, the coupling of rf-SQUID 510-*b* changes sign to ferromagnetic.

In an embodiment of the present invention, an rf-SQUID coupler is configured to provide ferromagnetic or anti-ferromagnetic coupling by applying an external magnetic field to the rf-SQUID coupler. In an embodiment of the present invention, the external magnetic field has a flux close to zero and the coupling is anti-ferromagnetic. In an embodiment of the present invention, the magnetic field has a flux close to $\Phi_0/2$ and the coupling is ferromagnetic. In an embodiment of the present invention, a flux bias device is inductively coupled to the rf-SQUID coupler and the flux bias device provides the external magnetic field described above. In some embodiments of the present invention, a magnetic field is applied to the coupling device that is between about $-5*\Phi_0$ and about $+5*\Phi_0$, with an accuracy of about $\pm 0.1*\Phi_0$, where $\Phi_0$ is the flux quantum and $\Phi_0=2.067\times10^{-15}$ Webers (Wb). In some embodiments, the accuracy is $\pm 0.2*\Phi_0$ or lower.

Figure 7:
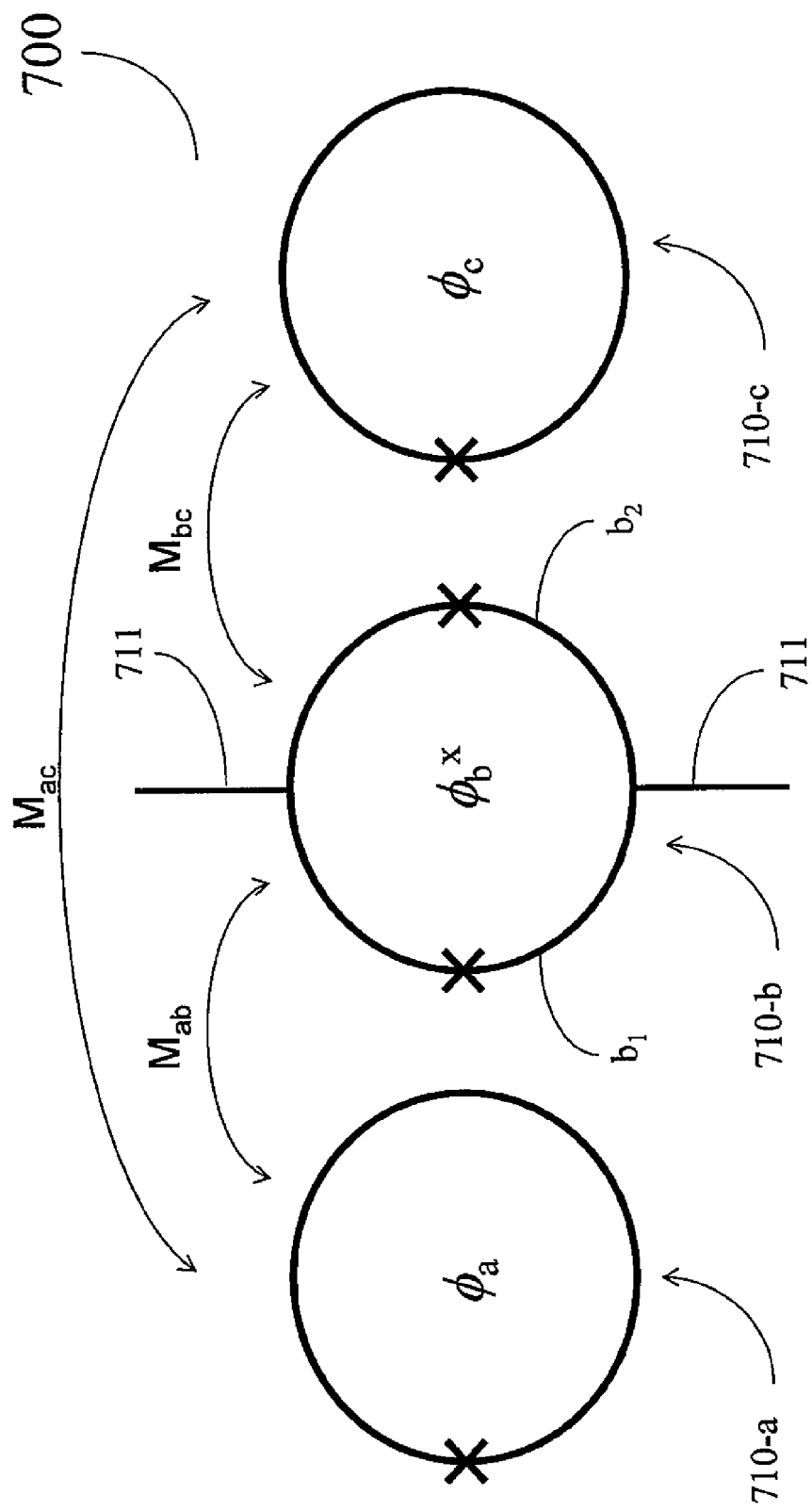
FIG. 7 illustrates another tunable coupling between flux devices using a dc-SQUID in accordance with an embodiment of the present invention.

FIG. 7 illustrates two information devices 710-*a* and 710-*c* coupled by dc-SQUID 710-*b*. Information devices 710-*a* and 710-*c* as shown in FIG. 7 are rf-SQUIDs, but they can be any other flux-based information device. Dc-SQUID 710-*b* comprises two Josephson junctions in a superconducting loop with two terminals 711 located between the junctions. While rf-SQUID coupler 510-*b* of FIG. 5 has only a flux bias, dc-SQUID coupler 710-*b* of FIG. 7 can be flux biased or current biased. Current bias can be provided by applying a current to dc-SQUID 710-*b* through terminals 711. Flux bias can be applied by an inductive current loop in close proximity to the loop of the dc-SQUID.

Appropriate current and flux bias tuning can mediate the coupling provided by dc-SQUID 710-*b* in order to controllably tune the strength of the coupling, turn the coupling off, or switch the sign of the coupling. Consider the case in which the external current bias on dc-SQUID 710-*b* is denoted $I_b$ and the external flux bias is denoted $\phi_b^X$. Further $\beta_b$ is much less than 1 (however, the case can be extends to higher values of $\beta_b$). When the dc-SQUID is symmetric, meaning that it has identical or near-identical Josephson junctions, the dc-SQUID can provide ferromagnetic coupling provided that $\cos^2(\phi_b^X/2) < |I_b/2I_c| < |\cos(\phi_b^X/2)|$, where $I_c$ is the critical current of the Josephson junctions in dc-SQUID 710-*b*. If the flux bias was zero, then there is no value of the current bias that would provide ferromagnetic coupling. Anti-ferromagnetic coupling is achieved when $\cos^2(\phi_b^X/2) > |I_b/2I_c|$. When $\cos^2(\phi_b^X/2) = |I_b/2I_c|$, the coupling is equal to zero. Thus, for a symmetric dc-SQUID, both current bias and flux bias are needed in order to switch the sign of the coupling.

Figure 8:
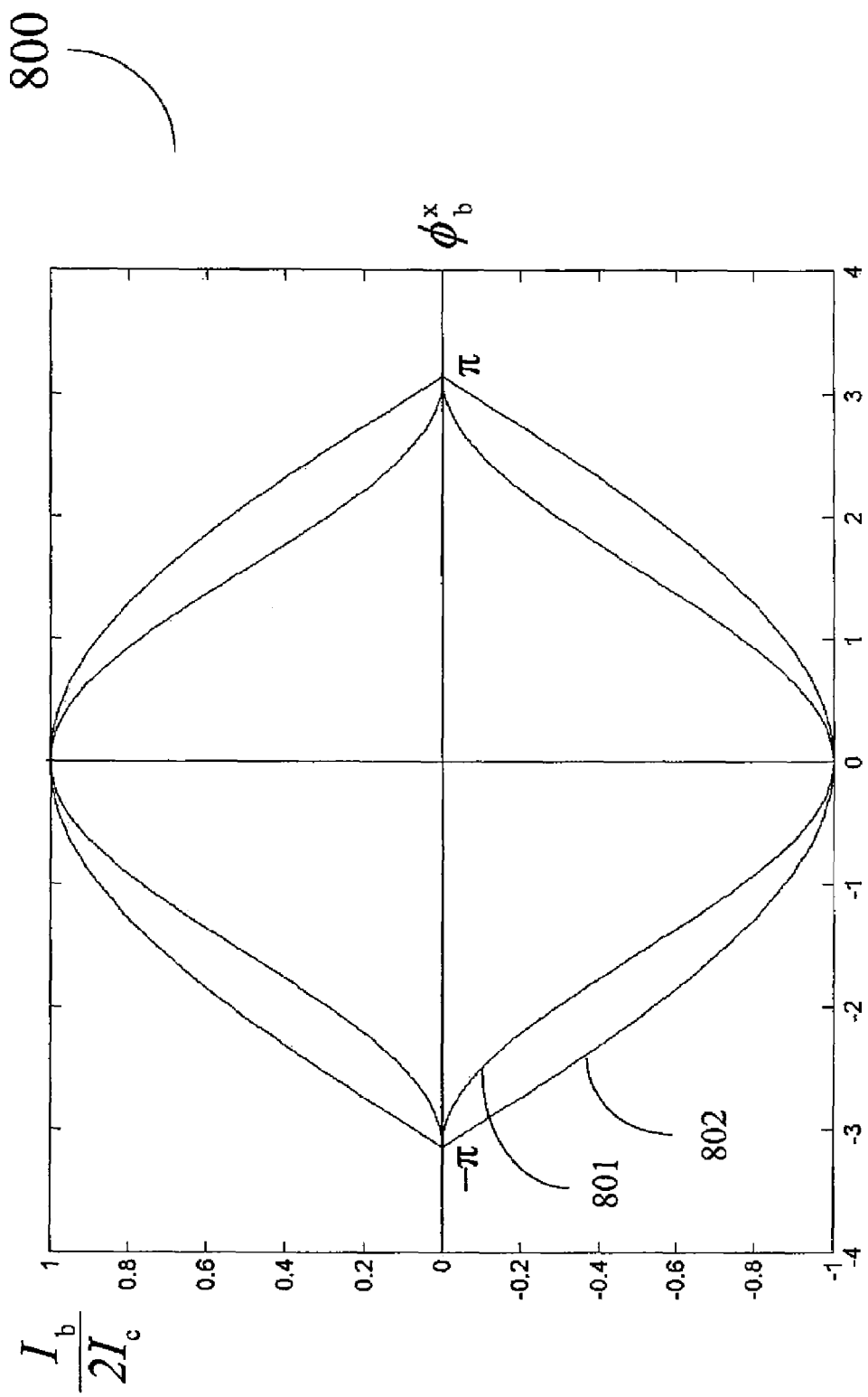
FIG. 8 is a graph of the normalized external current bias versus the external flux bias for a dc-SQUID in accordance with an embodiment of the present invention.

FIG. 8 illustrates the graph of the inequalities for the symmetric dc-SQUID case in the limit of $\beta_b$ much less than one, corresponding to the calculations above. The horizontal axis is the external flux bias $\phi_b^x$, while the vertical axis is the normalized external current bias $I_b/2I_c$. Curve 801 is the lower limit $\cos^2(\phi_b^x/2)$, while curve 802 is the upper limit $\cos(\phi_b^x/2)$. Thus, the area of the graph inside curve 801 represents the range of flux and current bias that will provide anti-ferromagnetic coupling, with the area close to the origin having the strongest anti-ferromagnetic coupling. Curve 801 itself represents the contour of flux and current bias that result in zero coupling. The area bounded by curves 801 and 802 represents the range of flux and current bias that will provide ferromagnetic coupling. As the flux and current bias moves away from curve 801 toward curve 802, the ferromagnetic coupling becomes stronger. However, once the bias reaches curve 802 itself, the Josephson junctions switch into the voltage state and the ferromagnetic coupling becomes unstable. Therefore, the bias on the dc-SQUID coupler should not pass outside curve 802. As can be seen, a nonzero flux bias ($\phi_b^x \neq 0$) is needed for ferromagnetic coupling.

For an asymmetric dc-SQUID, a current bias is not necessary to tune the strength and sign of the coupling, since the flux bias alone can switch the sign of the coupling. As an example, when one of the Josephson junctions in the dc-SQUID is shorted out (e.g. its Josephson energy is infinite), then the dc-SQUID is essentially an rf-SQUID, which has been previously shown to have the ability to switch the sign of the coupling without the use of a current bias. In some embodiments of the present invention, dc-SQUID coupler 710-b is symmetric and has both a current and flux bias. In some embodiments of the present invention, dc-SQUID coupler 710-b is asymmetric and only has a flux bias. In some embodiments of the present invention, dc-SQUID coupler 710-b is also configured to read out the state of either information device 710-a and 710-c.

In an embodiment of the present invention, dc-SQUID 710-b has a dimensionless inductance slightly less than one to ensure monostability and a strong coupling. In an embodiment of the present invention, dc-SQUID 710-b has a dimensionless inductance between 0.7 and 1. In another embodiment of the present invention, dc-SQUID 710-b has a dimensionless inductance between 0.8 and 1. In yet another embodiment of the present invention, dc-SQUID 710-b has a dimensionless inductance between 0.5 and 2. In another embodiment of the present invention, dc-SQUID 710-b has a dimensionless inductance between 0.9 and 1.1. In an embodiment of the present invention, rf-SQUIDs 710-a and 710-c have dimensionless inductances greater than 1 but less than 2.

In some embodiments of the present invention, when the coupling device (rf-SQUID 510-b or dc-SQUID 710-b) in either FIG. 5 or 7 is turned off, there is no coupling between the information devices (510-a and 510-c, or 710-a and 710-c). In some embodiments of the present invention, there is still direct inductive coupling between the information devices when coupling device is off. In this case, the coupling device can be tuned to specific values using a flux bias device or current bias device to cancel out the direct inductive coupling to zero.

In some embodiments of the present invention, an array of information devices uses tunable flux transformers, such as rf-SQUID 510-b or dc-SQUID 710-b, as coupling devices. In an embodiment of the present invention, the array of information devices is two-dimensional and each device in the interior of the array is coupled to its four nearest neighbor flux devices using rf-SQUID or dc-SQUID couplers. In an embodiment of the present invention, the array of information devices is a one-dimensional chain with the rf-S QUID or dc-SQUID couplers disposed between each device. It can be appreciated that other arrangements of the array of information devices and their respective couplers are possible.

Direct Josephson Junction Coupling

In an aspect of the present invention, one or more Josephson junctions galvanically coupled (e.g., inductively coupled or capacitively coupled) to two information devices can tunably couple the two information devices together. This tunable coupling can switch the sign of the coupling from ferromagnetic to anti-ferromagnetic and vice versa. In some embodiments of the present invention, a plurality of information devices are coupled together using galvanically connected Josephson junctions.

Figure 9:
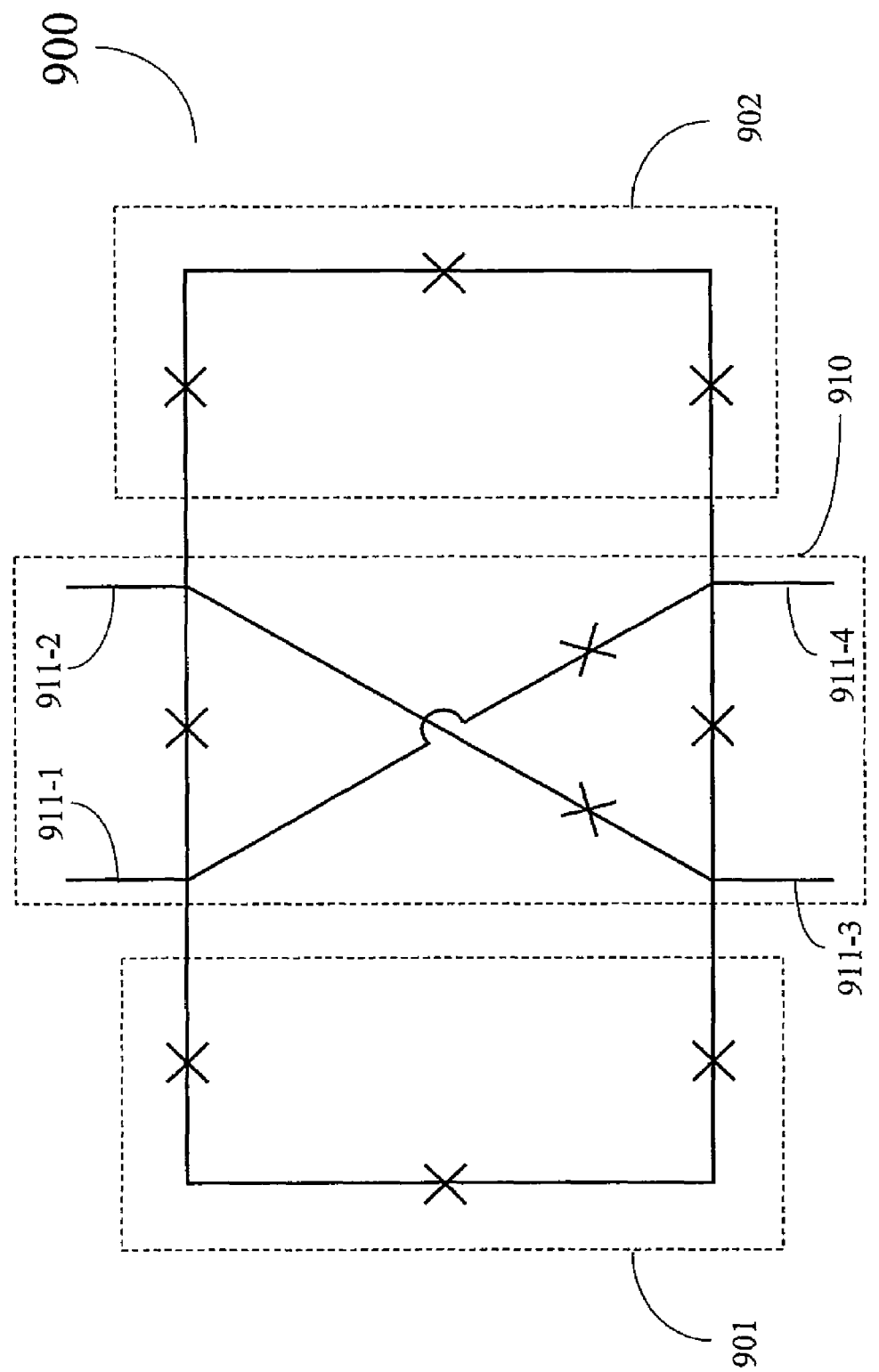
FIG. 9 illustrates a tunable coupling between information devices using direct Josephson junction coupling in accordance with an embodiment of the present invention.

FIG. 9 shows a system 900 that employs such direct Josephson junction coupling. Information devices 901 and 902 are flux devices comprising three Josephson junctions in a superconducting loop, but need not be restricted to such an architecture. Coupling device 910 comprises four Josephson junctions arranged in a cross-loop design that galvanically couple flux devices 910 and 902 together. Coupling device 910 also comprises four wires 911 that can provide a current bias for the coupling device. The Josephson junctions in coupling device 911 are large in size compared to the Josephson junctions of flux devices 901 and 902. In an embodiment of the present invention, there is no magnetic flux threading the coupling device 910, which means that the cross-wires of coupling device 910 are fabricated to be almost on top of each other, but on different layers.

Let the external current bias in the wires 911 be denoted $I_1$, $I_2$, $I_3$, and $I_4$ for wires 911-1, 911-2, 911-3, and 911-4 respectively. There is a wide range of tunability for wires 911, but the sum of currents in the four wires must be equal to zero during operation of coupler 910 as a coupling device. Current can flow through the cross-wires of the coupling device (911-1 to 911-4 or vice versa; 911-2 to 911-3 or vice versa) or through the horizontal wires of the coupling device (911-1 to 911-2 or vice versa; 911-3 to 911-4 or vice versa). Depending on how the wires are biased, both ferromagnetic and anti-ferromagnetic coupling can be produced. Current flowing through the cross-wires produces an anti-ferromagnetic coupling while current flowing through the horizontal wires produces a ferromagnetic coupling.

Two useful sets of current configurations arise. The first is $I_1 = -I_2 = -I_3 = I_4 = I$, where I is an arbitrary current value that is between zero and the critical current of the Josephson junctions in coupling device 910. The magnitude of I determines the strength of the coupling. When biased in this manner, no current flows through the cross wires but, rather, current flows through the horizontal wires. In this current configuration, the ferromagnetic interaction dominates over the anti-ferromagnetic interaction, and therefore flux devices 901 and 902 are coupled ferromagnetically. The second configuration is $I_1 = I_2 = -I_3 = -I_4 = I$. In this scenario, the current flows through the cross-wires and not through the horizontal wires. This produces a net anti-ferromagnetic coupling between flux devices 901 and 902. Thus, by appropriate current bias of wires 911, coupling device 910 can mediate switching of the sign of the coupling between flux devices 901 and 902.

In some embodiments of the present invention, not all the current bias in wires 911 have to have the same magnitude, but must maintain the correct sign. If the current bias magnitudes are close but not equal in magnitude, then current will flow in both the cross-wires and horizontal wires, creating both a ferromagnetic coupling component and an anti-ferromagnetic coupling component. However, the sign of the current bias will ensure that the coupling device will have a dominant preference for the flow of current and therefore one type of coupling will typically dominate the other in strength. In some embodiments of the present invention, the current bias of wires 911 can tune the coupling strength by appropriate tuning of the individual biases. In some embodiments of the present invention, the current bias of wires 911 can be chosen to provide zero coupling between two information devices.

Figure 10:
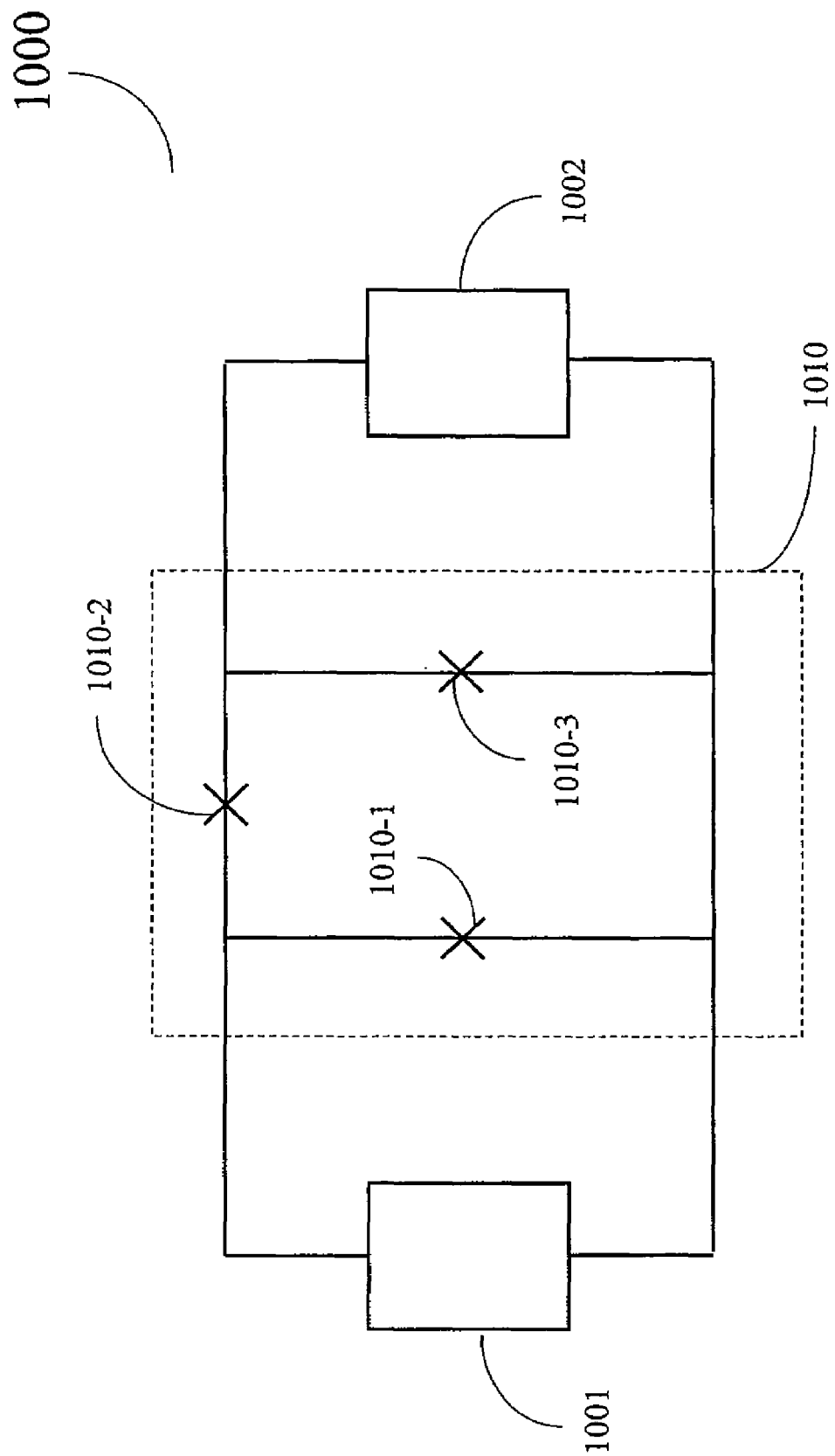
FIG. 10 illustrates another tunable coupling between information devices using direct Josephson junction coupling in accordance with an embodiment of the present invention.

FIG. 10 shows a system 1000 that includes another embodiment of direct Josephson junction coupling. In FIG. 10, boxes 1001 and 1002 represent information devices and can have many different architectures. For example, one embodiment of an information device 1001 and/or 10002 is the three Josephson junction flux device 901 (and 902) illustrated in FIG. 9.

Coupling device 1010 comprises three Josephson junctions 1010-1, 1010-2, and 1010-3 in a superconducting loop galvanically connected to both information devices 1001 and 1002. With appropriate tuning, coupling device 1010 can provide both ferromagnetic and anti-ferromagnetic coupling between the information devices. Coupling device 1010 is biased through its superconducting loop by an external flux bias $\phi_b^X$. The Hamiltonian of the interaction between the information devices when using coupling device 1010 is $$H_{int} = \frac{E_2 \cos\phi_b^x}{4e^2 E_1 E_3} I_a I_c \qquad (25)$$

where $E_j$ is the Josephson energy of Josephson junction 1010-1 ($E_1$), 1010-2 ($E_2$), or 1010-3 ($E_3$), $I_a$, is the critical current of flux device 1001, and $I_b$ is the critical current of flux device 1002. Therefore, depending on the value of the external flux bias, the sign of the interaction can be switched from positive to negative or vice versa. This is the same as switching from anti-ferromagnetic to ferromagnetic and vice versa. Also, the magnitude of the coupling interaction can be tuned by tuning the external flux bias and can be made zero for certain values of the bias. The coupling strength is maximum when $|\cos \phi_b^X|=1$, which corresponds to $\phi_b^X$ being an integer multiple of $\pi$. The coupling strength is zero when $\cos \phi_b^X=0$, which corresponds to $\phi_b^X$ being a multiple of either $\pi/2$ or $3\pi/2$.

In some embodiments of the present invention, a plurality of information devices are coupled together using a plurality of direct Josephson junction coupling devices. Examples of such devices are device 910 in FIG. 9 and device 1010 in FIG. 10. In some embodiments of the present invention, both coupling devices 910 and 1010 are used in the same circuit. In some embodiments of the present invention, the plurality of flux devices comprises a two-dimensional grid with flux devices coupled to their nearest neighbors using direct Josephson junction coupling devices. In other embodiments, the plurality of flux devices comprise a one-dimensional chain with flux devices coupled to their nearest neighbours using direct Josephson junction coupling devices.

Variations in Fabrication of Coupling Devices

It can be appreciated that there are many ways to fabricate the various embodiments of the invention. These methods of fabrication are well known in the art. Examples of such art have been incorporated by reference in the background section of the specification.

One specific fabrication embodiment that can be employed with the present invention is the concept of fabricating a coupling device utilizing two layers. Normally, the superconducting loop of a coupling device such as rf-SQUID 510-*b* of FIG. 5 and dc-SQUID 710-*b* of FIG. 7 are fabricated on a single layer of a superconducting chip. That is, the superconducting loop is solely contained on one layer of the circuit. A superconducting loop fabricated in this manner may take up a considerable amount of available surface area (real estate) on the chip where no other wires or devices can be placed. Also, such a design is not fully advantageous because there exists a parasitic capacitance between the superconducting loop and surrounding elements of the chip. Thus, surrounding elements need to be positioned away from the superconducting loop, which takes up even more of the available surface area (real estate) on the chip. To address these drawbacks, in some embodiments of the present invention, a section of the superconducting loop of a coupling device is fabricated on a separate layer on the chip. For example, rf-SQUID 510-*b* is fabricated such that it comprises two small open loops on a first layer of the chip coupled to SQUIDS 510-*a* and 510-*c*. These open loops are connected to each other by two microstrip wires, one on the same layer as the open loops, and another on a second layer connected to the first layer by vias, thus creating one continuous closed loop that couples SQUIDS 510-*a* and 5109-*c* together. A Josephson junction is present in one of the strips. In some embodiments, the two microstrips are fabricated with one directly above the other. In some embodiments, the second layer is a ground plane of a chip. In some embodiments, a plurality of coupling devices is fabricated in this manner with one open loop from each of the coupling devices occupying one layer and another open loop from each of the coupling devices occupying another layer in the plurality of coupling devices.

When the coupling devices are fabricated in this manner, the available horizontal surface area on the chip (real estate) that is taken up by the coupling device is reduced, since the superconducting loop of the coupling device has effectively been turned vertically. Thus more devices can be placed on the chip. This fabrication method does not prohibit the resultant coupling devices from operating in the fashion described in the present invention. Also, this configuration reduces the amount of parasitic capacitance that from the superconducting loops in the coupling devices. What follows are detailed analytical examples of the couplings that the dcSQUID and rf-SQUID can facilitate between two rf-SQUID flux devices.

EXAMPLE 1

Tunable Coupling of Flux Devices Through an rf-SQUID Transformer

FIG. 5 illustrates how the dynamics of three rf-SQUIDs 510-*a*, 510-*b*, and 510-*c*, including the tunability of the sign of coupling, can be modeled by an analysis beginning at the classical potential of the rf-SQUIDs. In this example, a, b, c-SQUID or a, b, and c denote rf-SQUIDs 510-*a*, 510-*b*, and 510-*c*, respectively. Hereafter, in this example a, b, and c as a superscript, subscript, or connected to a value or term by a hyphen denotes a value in relation to rf-SQUIDs 510-*a*, 510-*b*, and 510-*c*. Values and quantities drawn to these rf-SQUIDs include but are not limited to:

L, the rf-SQUID inductance;
B, the dimensionless SQUID inductance (defined to be equal to $2\pi L I_c/\Phi_0$ in SI units, when $\hbar=1$ this becomes $4e^2LE$);
C, the rf-SQUID capacitance;
$I_c$, the critical current of the rf-SQUID;
E, the rf-SQUID Josephson energy (defined to be $\frac{\hbar}{2e}I_c$);

$I_j$, the current of rf-SQUID 510-$j$, where j=a, b, or c;
$\Phi_j$, the flux of rf-SQUID 510-$j$, where j=a, b, or c;
$\phi_j$, the dimensionless flux, where j=a, b, or c;
$\phi_j^X$, the dimensionless external flux 'X' applied to rf-SQUID 510-$j$, where j=a, b, or c;
$\phi_{tot}$, the total flux of an rf-SQUID,
$M_{ij}$, the mutual inductance, where i,j=a, b, or c, etc.

As shown, in FIG. 5, three rf-SQUIDs 510-$a$, 510-$b$, and 510-$c$ are considered. The rf-SQUIDs 510-$a$ and 510-$c$ are degenerately biased flux devices, while 510-$b$ rf-SQUID is a coupling element, tunable by an external flux bias (not shown). To obtain indirect coupling between information devices 510-$a$ and 510-$c$, it suffices to consider the potential:

$$U = -E_a\cos\phi_a - E_b\cos\phi_b - E_c\cos\phi_c + \frac{1}{8e^2}(\vec{\phi}-\vec{\phi}^x)^T L^{-1}(\vec{\phi}-\vec{\phi}^x), \quad (1)$$

with the inductance matrix $$L = \begin{pmatrix} L_a & -M_{ab} & 0 \\ -M_{ab} & L_b & -M_{bc} \\ 0 & -M_{bc} & L_c \end{pmatrix}. \quad (2)$$

That is, the direct anti-ferromagnetic inductive 510-$a$ to 510-$0c$ coupling is assumed to be small. This can be achieved, for example, through the use of gradiometric information devices described above. However, as long as $M_{ac}$ is small, an interaction term $M_{ac}I_aI_c$ can be added to the final result (9) below. In accordance with the roles played by the various loops, as previously described, in some embodiments the flux biases are chosen as $$\vec{\phi}^x = \begin{pmatrix} \pi + \left(\frac{M_{ab}}{L_b}\right)(\phi_b^0 - \phi_b^x) \\ \phi_b^x \\ \pi + \left(\frac{M_{bc}}{L_b}\right)(\phi_b^0 - \phi_b^x) \end{pmatrix}. \quad (3)$$

where, $\vec{\phi}^x$ is a column vector with elements $\phi_a^X$, $\phi_b^X$, and $\phi_c^X$. Thus, $\phi_{a,c}^X$ compensates externally for the shielding flux that loop 510-$b$ couples into the a- and c-SQUIDs. See equation (6) below for a definition of $\phi_b^0$.

If the b-SQUID is to act as a passive coupler without introducing additional degrees of freedom, the b-SQUID should not be bistable. Therefore, in embodiments of the present invention where there is an rf-SQUID acting as a coupler, the rf-SQUID is preferably monostable. Monostability can be achieved either by biasing the rf-SQUID with a flux close to an integer number of quanta ($\phi_b^X$ small), or for any flux bias by making the rf-SQUID such that the dimensionless inductance is less than one. That is, $\beta b = 4e^2 L_b E_b < 1$ (here, $\hbar=1$; in SI units, $\beta=2\pi LI_c/\Phi_0$). This dimensionless inductance value can be achieved by reducing $E_b$ while keeping the area of the b-loop, and hence the inductive coupling, appreciable. Reducing the critical current density of the Josephson junction during manufacturing, or the cross-sectional area of the Josephson junction in the rf-SQUID, corresponds to reducing the critical current of the rf-SQUID. In some embodiments a shunting capacitance is placed across the Josephson junction in rf-SQUID 510-$b$ in order to keep the b-SQUID in the flux regime. The calculation that follows is valid in either case, and their relative merits will be discussed afterwards. In addition, even a SQUID with a unique potential minimum will have excited states, corresponding to plasma oscillations. While these are outside the scope of the present semiclassical analysis, the corresponding excitation energies should be different from any transition in the a- and c-devices if the b-SQUID is to remain passive.

Proceeding by expansion in M. Without suggesting that the regime of M/L is much less than 1 (say, distant loops) is the most practical, this leads to a transparent result, which can guide numerical studies in the general case. The b-mediated a-c coupling is expected to be $O(M^2)$ so the junction phases will be written as $$\phi_j = \phi_j^0 + \chi_j + \xi_j + O(M^3), \quad (4)$$

and can be determined by solving the equilibrium condition $\nabla_{\vec{\phi}} = 0$. In leading order, these are just the stationary phases of an isolated rf-SQUID, $$\beta_j \sin\phi_j^0 + \phi_j^0 - \pi = 0 \quad (j=a,c), \quad (5)$$

$$\beta_b \sin\phi_b^0 + \phi_b^0 - \phi_b^X = 0, \quad (6)$$

where $\phi_{a,c}^0 - \pi$ it can have either sign. The inverse inductance matrix is needed to the same order $$L^{-1} = \begin{pmatrix} \frac{1}{L_a} + \frac{M_{ab}^2}{L_a^2 L_b} & \frac{M_{ab}}{L_a L_b} & \frac{M_{ab}M_{bc}}{L_a L_b L_c} \\ \frac{M_{ab}}{L_a L_b} & \frac{1}{L_b} + \frac{M_{ab}^2}{L_a L_b^2} + \frac{M_{bc}^2}{L_b^2 L_c} & \frac{M_{bc}}{L_b L_c} \\ \frac{M_{ab}M_{bc}}{L_a L_b L_c} & \frac{M_{bc}}{L_b L_c} & \frac{1}{L_c} + \frac{M_{bc}^2}{L_b L_c^2} \end{pmatrix} + O(M^3). \quad (7)$$

Use of (7) consistently leads to significant cancellations as described below.

In O(M), one finds that $\chi_{a,c}=0$ due to the special choice of $\vec{\phi}^X$ in (3), while the b-loop picks up the shielding fluxes of the neighboring ones, with a pre-factor reflecting its susceptibility:

$$\chi_b = [1+\beta_b\cos\phi_b^0]^{-1}\left[\frac{M_{ab}}{L_a}(\pi-\phi_a^0) + \frac{M_{bc}}{L_c}(\pi-\phi_c^0)\right]. \quad (8)$$

Calculating the $\xi_j$ in $O(M^2)$ is unnecessary. Since one expands around a minimum of U, the $\xi_j$ does not contribute to the relevant order.

All that remains is to substitute (3)-(8) into U in (1). Since, e.g., $(\phi_a^0 - \pi)^2$ does not depend on the flux device state, one is left with $$U = const + \frac{M_{ab}M_{bc}}{4e^2 L_a L_b L_c} \frac{\beta_b\cos\phi_b^0}{1+\beta_b\cos\phi_b^0}(\phi_a^0-\pi)(\phi_c^0-\pi). \quad (9)$$

The first factor contains the product of mutual inductances expected geometrically. The last two factors are $\propto I_a I_c$, or $\sigma_a^z\sigma_c^z$ in quantum computing terms. The second factor is:

$$\frac{\beta_b \cos\phi_b^0}{1+\beta_b \cos\phi_b^0} \approx \begin{cases} \beta_b \cos\phi_b^x, & \beta_b \ll 1, \\ 1, & \beta_b \gg 1. \end{cases} \quad (10)$$

Thus, for small $\phi_b^X$, the coupling is anti-ferromagnetic, but it changes sign to ferromagnetic as $\phi_b^X \to \pi$ (only attainable for $\beta_b < 1$).

FIG. 6 shows a graph 600 modeling the total flux of an rf-SQUID such as 510-b versus the applied external flux ($\Phi_{tot}$ versus $\Phi_x$ curve), also known as the S-curve. The external flux is applied to the loop of the rf-SQUID and the difference between the total and external flux is generated by the current in the rf-SQUID. Curves 610, 620, 630 of graph 600 can be generated by plotting equation 6 with $\phi_b^X$ in terms of $\phi_b^0$ and $\beta_b$. Curve 610 corresponds to case where $\beta_b = 0$, and a 45 degree line as expected for an open loop.

The behavior as modeled by equations 9 and 10, and the coupling mechanism in general, have a transparent interpretation. Consider curve 620 for which $\beta_b \ll 1$, as an instance of the S-curve $\phi_b^O(\phi_b^X)$ of the free b-SQUID. If the a-device flips from ↑ to ↓, then due to the mutual inductance $-M_{ab} < 0$ this effectively increases $\phi_b^X$. For small $\phi_b^X$, near zero on the $\phi_b^X$ axis, the mentioned S-curve has slope less than one (<1), so that this increase gets partially shielded by the b-loop's self-flux in the ↓-direction. In its turn, the latter, through $-M_{bc} < 0$, acts as an ↑-bias for the c-loop, favoring the ↑-state there, e.g., opposite to the state of the a-device. This also explains the bound of unity exemplified by the case in (10) where $\beta_b \gg 1$, since the maximum anti-ferromagnetic response is perfect shielding for $\beta_b \to \infty$. This corresponds to an uninterrupted superconducting loop. However, near $\phi_b^X = \pi$ the argument works in the opposite direction. There, the S-curve has slope greater than one (>1) so that, differentially, the self-flux does not shield at all but actually cooperates with the increase in external flux. Thus, the coupling changes sign to ferromagnetic.

As $\beta_b$ approaches one from beneath ($\beta_b < 1$), the slope of the S-curve at it increases without bound (a precursor to bistability), allowing the ferromagnetic coupling to be large. This corresponds to the zero in the denominator of (10). This is shown as curve 630 of graph 600. On the one hand, the divergence is never realized in practice, since for any finite M's one deals with finite differences, not slopes, on the S-curve. It should be noted that the shielding current is the derivative of the energy with respect the external flux, induced coupling strength is proportional the second derivative of finite difference of the SQUID band structure. The potentially large ferromagnetic coupling makes it possible to overcome any residual direct anti-ferromagnetic coupling through $M_{ac}$. Since (10) shows that the large-$\beta_b$ regime is quite inflexible, and that for $\beta_b \ll 1$ the coupling strength is limited by the small shielding flux, this case $\beta_b \lesssim 1$ is preferred in some embodiments of the present invention.

With β greater than one the rf-SQUID is bistable. This corresponds to the case of curve 640 in graph 600. The metastable states disappear at certain levels of applied flux, and the state of the rf-SQUID transitions. As indicated above, a bistable rf-SQUID is used as a flux device in some embodiments of the present invention.

In some embodiments, the a- and c-SQUIDs are placed inside a large b-loop, which changes the sign of both $M_{ab}$ and $M_{bc}$ so that (9) is invariant. This design modification makes it clearer that the b-loop is mostly a flux transformer, with a Josephson junction providing the tunability. Moreover, the final result (9) depends only trivially on the properties of the a- and c-devices, specifically through the flux which the a- and c-devices couple into the b-SQUID. Hence, the generalization to other types of flux devices should be apparent.

An aspect of the present invention is that there is no requirement that coupler SQUID 510-b be galvanically coupled with external circuitry. This may be advantageous for limiting decoherence.

EXAMPLE 2

Tunable Coupling of Flux Devices Through a dc-SQUID Transformer

This example analyzes the set-up depicted in FIG. 7, specifically that of two rf-SQUID flux devices 710-a and 710-c coupled with dc-SQUID 710-b. In the example, a, b, c-SQUID or a, b, and c denote rf-SQUID 710-a, dc-SQUID 710-b, and rf-SQUID 710-c, respectively. Hereafter, in this example a, b, and c as a superscript, subscript, or connected to a value or term by a hyphen denotes a value in relation to SQUIDs 710-a, 710-b, and 710-c. Values and quantities drawn to these SQUIDs include L, the SQUID inductance;
β the dimensionless SQUID inductance (defined to be equal to $2\pi L I_c/\Phi_0$ in SI units; when $\hbar=1$ this becomes $4e^2LE$);
C, the SQUID capacitance;
$I_c$, the SQUID's critical current;
E, the SQUID Josephson energy $$\left(\text{defined to be } \frac{\hbar}{2e}I_c\right);$$

$I_j$, the current of SQUID 710-j, where j=a, $b_1$, $b_2$, or c;
$\Phi_j$, the flux of SQUID 510-j, where j=a, $b_1$, $b_2$, or c;
$\phi_j$, the dimensionless flux;
$\phi_j^x$, the dimensionless external flux 'X' applied to rf-SQUID 710-j;
$\phi_{tot}$, the total flux of a SQUID, etc.

In FIG. 7, dc-SQUID 710-b has two arms, each with its own Josephson junction. The left and right arms of dc-SQUID are denoted as $b_1$ and $b_2$ respectively, and together they carry a fixed bias current $I_b$.

Ignoring the mutual inductance between the a-SQUID and the c-SQUID, the coil-to-coil inductance matrix of the system is $$\begin{pmatrix} L_a & -M_{ab1} & -M_{ab2} & 0 \\ -M_{ab1} & L_{b1} & M_{b12} & -M_{b1c} \\ -M_{ab2} & M_{b12} & L_{b2} & -M_{b2c} \\ 0 & -M_{b1c} & -M_{b2c} & L_c \end{pmatrix} \quad (11)$$

where $L_j$ represents the inductance of the individual loops and $M_{ij}$ represents the mutual inductance between loops i and j. However, $I_{b2}=I_{b1}+I_b$, so the flux-current relates the three vectors pertaining to the loops is $$\Phi - \tilde{\Phi}^x = \tilde{L}I \quad (12)$$

$$\tilde{\Phi}^x = \Phi^x + (-M_{ab2}, \tilde{L}_{b2}, -M_{b2c})^T \quad (13)$$

$$\Phi = (\Phi_a, \Phi_b, \Phi_c)^T \quad (14)$$

where $$I = (I_a, I_{b1}, I_c)^T \quad (15)$$

$$\overline{L} = \begin{pmatrix} L_a & -M_{ab} & 0 \\ -M_{ab} & L_b & -M_{bc} \\ 0 & -M_{bc} & L_c \end{pmatrix} \quad (16)$$

$$M_{bc} = M_{b1c} + M_{b2c} \quad (17)$$
$$M_{ab} = M_{ab1} + M_{ab2}$$

$$\tilde{L}_{b2} = L_{b2} + M_{b12} \quad (18)$$
$$\tilde{L}_{b1} = L_{b1} + M_{b12}$$
$$L_b = \tilde{L}_{b1} + \tilde{L}_{b2}$$

On the other hand, the four Josephson junction phases are all independent dynamical variables.

Of the circuit equations governing system 700, four of them are the Josephson relations $\dot{\phi}_j = 2eQ_j/C_j$, where $Q_j$ is the charge, $C_j$ is the capacitance, and $\dot{\phi}_j$ is the phase derivative for $j = a, b_1, b_2,$ and c. The other four equations express current conservation $\dot{Q}_j = \pm 2e\partial H/\partial\phi_j$. The total Hamiltonian of system 700 is thus $$H = \sum_j \left[ \frac{Q_j^2}{2C_j} - E_j \cos\phi_j \right] + \frac{1}{2}(\Phi - \Phi^x)\overline{L}^{-1}(\Phi - \Phi^x) + \frac{I_b}{2e}\phi_{b2} \quad (19)$$

for $j = a, b_1, b_2,$ and c. His actually symmetric in the two dc-SQUID arms. H is a function of the junction phases and charge only, and the asymmetric choice of $I_{b1}$ as the loop current was merely an interim convention. That is, designating the last two terms of equation (19) as "magnetic" and "bias" energy, respectively, is a bit arbitrary. Working out $\overline{L}^{-1}$, up to a constant, equation (19) can be rewritten as $$H = \sum_j \left[ \frac{Q_j^2}{2C_j} - E_j \cos\phi_j \right] + \frac{1}{2}(\Phi - \Phi^x)\overline{L}^{-1}(\Phi - \Phi^x) + H_b \quad (20)$$

where $H_b$ is a complex function of the system inductances and phases.

From here on, the analysis is a generalization of the rf-SQUID case, again writing the phases in the form of Equation (4) and expanding $H_b$ to the same order. The a- and c-devices should be effectively at degeneracy, which means that their own external flux should compensate for $I_b$. In $O(M^0)$, the stationary phases obey the standard equations for the isolated devices:

$$\beta_j \sin\phi_j^0 + \phi_j^0 - \pi = 0 \quad (21)$$

$$\beta_{b1} \sin\phi_{b1}^0 + \phi_{b1}^0 + \phi_{b2}^0 - \phi_b^x - 2eI_b\tilde{L}_{b2} = 0 \quad (22)$$

$$\beta_{b2} \sin\phi_{b2}^0 + \phi_{b1}^0 + \phi_{b2}^0 - \phi_b^x + 2eI_b\tilde{L}_{b1} = 0 \quad (23)$$

Here, $\beta_{a(c)} = 4e^2 L_{a(c)} E_{a(c)}$ is standard, but note that the definitions $\beta_{bj} = 4e^2 L_b E_{bj}$ (j=1, 2) involve the full loop inductance of the b-SQUID, not the individual arm inductances.

Like for the rf-SQUID case, it is best to leave the $\xi_j$ unevaluated in the M-expansion of U, and one sees that their contribution cancels (to this order), since one expands around a potential minimum. Taking advantage of further cancellation and dropping all terms which do not depend on the flux device state, one arrives at $$U = const + \frac{M_{ab}M_{bc}}{4e^2 L_a L_b L_c} \frac{\beta_{b1}\beta_{b2}\cos\phi_{b1}^0 \cos\phi_{b2}^0}{\beta_{b1}\cos\phi_{b1}^0 + \beta_{b2}\cos\phi_{b2}^0 + \beta_{b1}\beta_{b2}\cos\phi_{b1}^0 \cos\phi_{b2}^0} (\phi_a^0 - \pi)(\phi_c^0 - \pi) \quad (24)$$

in which all tenability thus comes via the dependence of $\phi_{b1(2)}^0$ on $(\phi_b^x, I_b)$ as given in equations (22) and (23). For a simple consistency check, take $I_b \to 0$ and $E_{b2} \to \infty$. Then (23) shows that $\phi_{b2}^0 = 0$ while (22) reduces to $\beta_{b1} \sin\phi_{b1}^0 + \phi_{b1}^0 - \phi_b^x = 0$, and the large fraction in (24) becomes $\beta_{b1} \cos\phi_{b1}^0 / [1 + \beta_{b1}\cos\phi_{b1}^0]$, which is exactly the result for rf-SQUID coupling.

Another case is the symmetric dc-SQUID with negligible shielding, for which (22) and (23) reduce to $\phi_{b1}^0 + \phi_{b2}^0 = \phi_b^x$ and $2I_c \cos(\phi_b^x/2)\sin(\phi_{b1}^0 - \phi_b^x/2) = I_b$. Even in this case, one can have ferromagnetic coupling for $\cos^2(\phi_b^x/2) < |I_b/2I_c| < |\cos(\phi_b^x/2)|$. While one thus needs a nonzero flux bias, tenability of $I_b$ suffices for changing the sign of coupling.

There are several notable features of this system. To achieve ferromagnetic coupling, one needs nonzero flux and current bias, the denominator in (24) is always positive, and $\cos\phi_{b1}^0$ and $\cos\phi_{b2}^0$ never become negative simultaneously. The need for a current bias is obvious in the case of a symmetric dc-SQUID, since for $I_b = 0$ one then has $\phi_{b1}^0 = \phi_{b2}^0$, and for any $\phi_b^x$ there is a stationary state with $\phi_{b1}^0 \leq \pi/2$. This cannot be generalized further, since the asymmetric dc-SQUID contains the rf-SQUID as a special case, and the latter can mediate ferromagnetic coupling without any current bias. The need for a flux bias is again easy to prove for symmetric devices with arbitrary shielding, which have $\phi_{b1}^0 = -\phi_{b1}^0$ for $\phi_b^x = 0$. In general, however, equations (22) and (23) show that an inductance imbalance between the two dc-SQUID arms can play the same role as a nonzero $\phi_b^x$.

Finally, the above analysis only shows that the potential part of equation (20) enables tunable coupling in the classical case. That is, there could be devices outside its regime of validity that are nonetheless suitable couplers, as long as the transformer remains passive, e.g., confined to its lowest energy state/band. See Averin et al. 2003, *Physical Review Letters* 91, 057003, which is hereby incorporated by reference in its entirety. For a quantum analysis, the interacting, biased Hamiltonian derived above can be immediately used as a starting point. Also, the method of M-expansion should again reduce the problem to one for the uncoupled, biased dc-SQUID.

EXAMPLE 3

Details and Fabrication of an rf-SQUID

Figure 11:
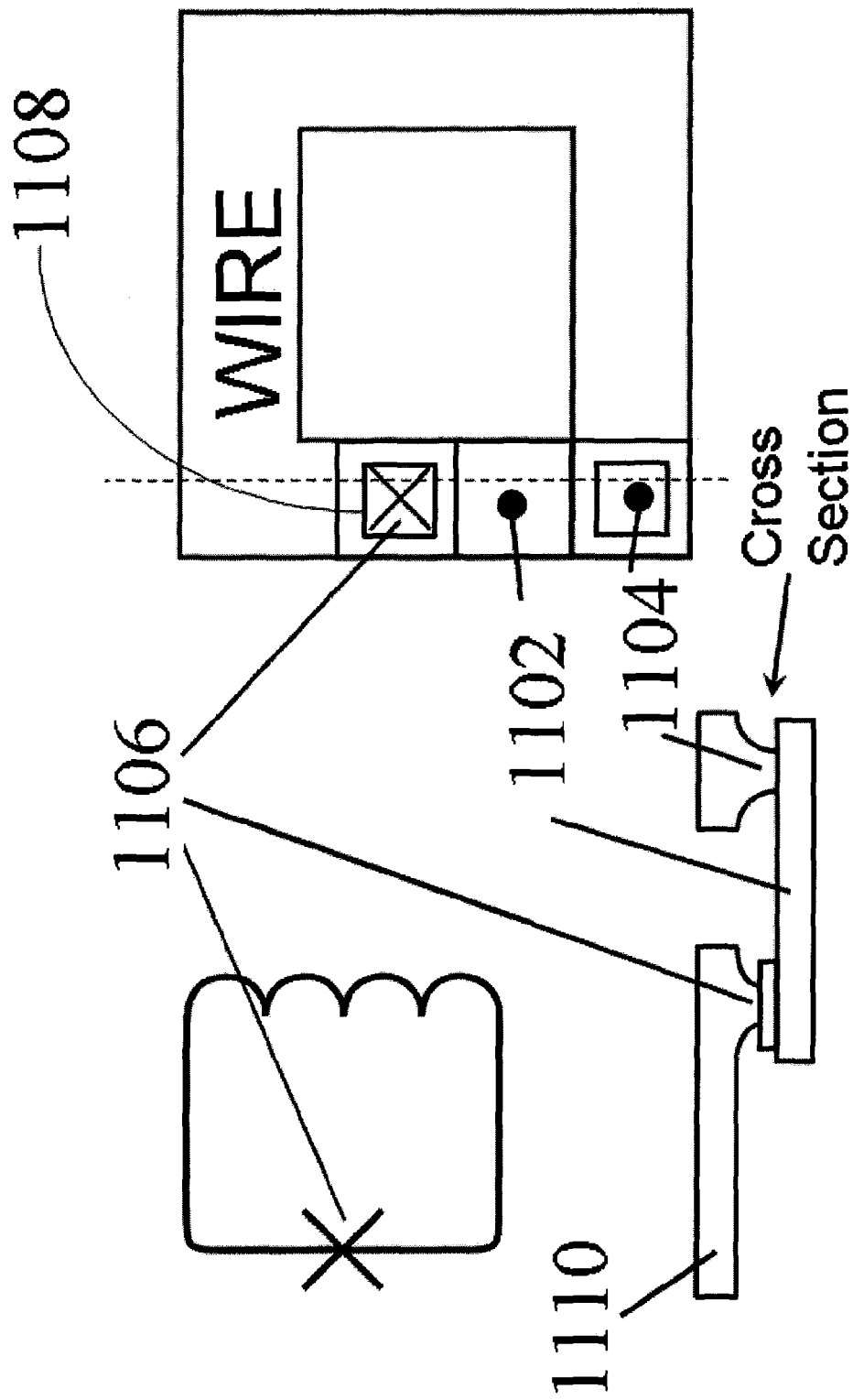
FIG. 11 illustrates a fabrication method in accordance with an embodiment of the present invention.

In some embodiments of the present invention, rf-SQUIDs are used that comprise a superconducting loop that has an inductor and that is interrupted by a single Josephson junction such that the inductor and Josephson junction are in parallel as illustrated in FIG. 11. For a given fabrication process, the Josephson junction is parameterized by its critical current $I_C$, the amount of current it can carry without any dissipation. The rf-SQUID design is then parameterized by the $I_C L$ product, where L is the inductance, or its dimensionless inductance $2\pi L I_C/\Phi_0$, where $\Phi_0$ is the flux quantum.

The behavior of the rf-SQUID is described in terms of its response to externally applied flux that is coupled into the SQUID's inductor. For a given applied flux, a circulating current is induced in the SQUID which corresponds to a particular flux state of the SQUID. For values of dimensionless inductance greater than 1, the rf-SQUID can be multistable, meaning that for a particular value of externally applied flux, there can be more than one stable flux state of the if-SQUID.

Many applications require that flux coupled into the rf-SQUID's inductor through a transformer. How efficiently this transformer couples flux is a design constraint, and through this there will usually be some constraint placed on the SQUID inductance. A particular application will typically also constrain the allowed dimensionless inductance of the SQUID, often to 1 or less. These two constraints determine the allowed range of junction critical current.

Modern fabrication of dc (two-junction) and rf (one junction) SQUIDs is typically performed in an all-refractory metal multiplayer integrated circuit process as is described, for example, by Fritzsch et al., 1999, *Superconducting Science & Technology*, Vol. 12, pp. 880-882, which is hereby incorporated by reference in its entirety. A typical fabrication process includes a Nb/AlO$_x$/Nb trilayer for fabrication of Josephson Junctions, one dielectric insulating layer from a material such as SiO$_2$, which may be sputter deposited using rf-magnetron sputtering, and an additional metalization layer for wiring. The metalization layers are typically Nb, deposited using dc-magnetron sputtering. The Nb/AlO$_x$/Nb trilayer can be deposited with dc-magnetron sputtering, with parameters chosen in such a way to obtain stress-free niobium. The AlO$_x$ layer can be grown on the base Nb layer by oxidation of a thin layer of aluminum (e.g. having a thickness of 70 Angstroms) deposited on the base Nb layer.

A sample layout is shown in FIG. 11. In the layout, the X represents Josephson junction 1106. The definition of the junction area can be made by a selective niobium isolation process (SNIP). See, for example, Shoji et al. 1982, *Applied Physics Letters* 41, 1097, which is hereby incorporated by reference in its entirety. Layer 1102 represents the base electrode of the junction trilayer used as the lower wiring layer. Layer 1110 represents the upper wiring layer. Square 1108 shows the area occupied by the Josephson junction which is formed from the trilayer and contacted by upper wiring layer 1110. Region 1104 represents a via: a direct connection between layers 1102 and 1110. The SQUID's inductance is made up of the loop formed by the connected structures on the lower 1102 and upper 1110 wiring layer. This inductance must typically be calculated in some way, with either analytical formula or three-dimensional electromagnetic modeling software. The critical current of the junction will be proportional to its area and the critical current density of the particular fabrication process.

Conclusion And References Cited

All references cited herein are incorporated herein by reference in their entirety and for all purposes to the same extent as if each individual publication or patent or patent application was specifically and individually indicated to be incorporated by reference in its entirety for all purposes.

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

We claim:

1. A method of tuning a coupling between a first information device and a second information device, the method comprising:

tuning a first coupling element that couples a first lobe of the first information device with a first lobe of the second information device; and tuning a second coupling element that couples the first lobe of the first information device with a second lobe of the second information device, wherein the first and second coupling elements are not in electrical communication with each other.

2. The method of claim 1, wherein
the tuning the first coupling element removes a first coupling between the first information device and the second information device; and
the tuning the second coupling element initiates a second coupling between the first information device and the second information device.

3. The method of claim 1, wherein the first coupling element is configurable to provide ferromagnetic coupling between the first information device and the second information device; and the second coupling element is configurable to provide anti-ferromagnetic coupling between the first information device and the second information device.

4. The method of claim 1, wherein the first coupling element is configurable to provide anti-ferromagnetic coupling between the first information device and the second information device; and the second coupling element is configurable to provide ferromagnetic coupling between the first information device and the second information device.

5. A method of removing a coupling between a first information device and a second information device, the method comprising:

configuring a first coupling element to couple a first lobe of the first information device with a first lobe of the second information device; and tuning a second coupling element that couples the first lobe of the first information device with a second lobe of the second information device, wherein the coupling between the first information device and the second information device produced by the tuning a second coupling element cancels the coupling between the first information device and the second information device produced by the configuring a first coupling element; and the first and second coupling elements are not in electrical communication with each other.

6. The method of claim 5, wherein the first coupling element comprises a dc-SQUID, and wherein the configuring a first coupling element comprises configuring at least one of a current bias and a flux bias.

7. The method of claim 5, wherein the first coupling element comprises an rf-SQUID, and wherein the configuring a first coupling element comprises configuring a flux bias.

8. The method of claim 5, wherein the second coupling element comprises a dc-SQUID, and wherein the tuning a second coupling element comprises tuning at least one of a current bias and a flux bias.

9. The method of claim 5, wherein the second coupling element comprises an rf-SQUID, and wherein the tuning a second coupling element comprises tuning a flux bias.

10. The method of claim 5, wherein
the first coupling element couples the first information device and the second information device together ferromagnetically; and
the second coupling element couples the first information device and the second information device together anti-ferromagnetically.

11. The method of claim 5 wherein the first information device is a first qubit and the second information device is a second qubit.

12. The method of claim 5 wherein the first information device is selected from the group consisting of: a flux device, a phase device, a charge device, a flux qubit, and a persistent current qubit; and wherein the second information device is selected from the group consisting of: a flux device, a phase device, a charge device, a flux qubit, and a persistent current qubit.

13. The method of claim 1 wherein the first coupling element is initially on and the second coupling element is initially off.

14. The method of claim 1 wherein the first coupling element is initially off and the second coupling element is initially on.

15. The method of claim 1 wherein the first information device is a first qubit and the second information device is a second qubit.

16. The method of claim 1 wherein the first information device is selected from the group consisting of: a flux device, a phase device, a charge device, a flux qubit, and a persistent current qubit; and wherein the second information device is selected from the group consisting of: a flux device, a phase device, a charge device, a flux qubit, and a persistent current qubit.

* * * * *